(12) United States Patent
Kanno et al.

(10) Patent No.: US 7,598,129 B2
(45) Date of Patent: Oct. 6, 2009

(54) LIGHT-EMITTING DEVICE AND METHOD FOR MANUFACTURING THE SAME

(75) Inventors: Yohei Kanno, Kanagawa (JP); Gen Fujii, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 402 days.

(21) Appl. No.: 10/576,692

(22) PCT Filed: Nov. 5, 2004

(86) PCT No.: PCT/JP2004/016809

§ 371 (c)(1),
(2), (4) Date: Apr. 21, 2006

(87) PCT Pub. No.: WO2005/048223

PCT Pub. Date: May 26, 2005

(65) Prior Publication Data

US 2007/0090358 A1    Apr. 26, 2007

(30) Foreign Application Priority Data

Nov. 14, 2003    (JP) ............................ 2003-386022

(51) Int. Cl.
*H01L 21/00* (2006.01)
*H01L 21/84* (2006.01)
(52) U.S. Cl. .................... 438/149; 438/151; 257/59; 257/72
(58) Field of Classification Search .................. 257/59, 257/72; 438/149
See application file for complete search history.

(56) References Cited

U.S. PATENT DOCUMENTS 5,747,930 A    5/1998  Utsugi (Continued)

FOREIGN PATENT DOCUMENTS

EP    0 684 753 A1    11/1995

(Continued)

OTHER PUBLICATIONS

International Search Report of Application No. PCT/JP2004/016809; PCT7498) Dated Mar. 1, 2005.

(Continued)

*Primary Examiner*—Kenneth A Parker
*Assistant Examiner*—Anthony Ho
(74) *Attorney, Agent, or Firm*—Nixon Peabody LLP; Jeffrey L. Costellia

(57) ABSTRACT

Especially in case that a light-emitting element composed of layers containing organic compounds or inorganic compounds is driven by a thin film transistor (TFT), a structure having at least two transistors installed with a drive TFT is required to prevent irregularities of ON current of a switching TFT provided to a pixel region. Hence, the simplification of a semiconductor element structure and a process for manufacturing a semiconductor element becomes an urgent task as a large substrate is frequently used. According to the present invention, after that a source region and a drain region are formed, an insulating film serving as a channel protective film is formed to cover a portion for serving as a channel region, then, an island-like semiconductor film is formed. Accordingly, a semiconductor element can be manufactured by using only a metallic mask without forming a resist mask, and so the process can be simplified.

24 Claims, 25 Drawing Sheets

U.S. PATENT DOCUMENTS

| | | | |
|---|---|---|---|
| 5,892,562 A | 4/1999 | Yamazaki et al. | |
| 6,013,930 A | 1/2000 | Yamazaki et al. | |
| 6,204,535 B1 | 3/2001 | Yamazaki et al. | |
| 6,429,059 B2 | 8/2002 | Yamazaki et al. | |
| 6,448,578 B1 | 9/2002 | Shimada et al. | |
| 6,573,955 B2 | 6/2003 | Murade | |
| 6,855,957 B1 | 2/2005 | Yamazaki et al. | |
| 6,908,796 B2 | 6/2005 | Furusawa | |
| 6,956,236 B1 | 10/2005 | Sasaki et al. | |
| 7,285,305 B2 | 10/2007 | Furusawa et al. | |
| 2001/0049163 A1 | 12/2001 | Yamazaki et al. | |
| 2003/0107039 A1 | 6/2003 | Jung et al. | |
| 2003/0219934 A1 | 11/2003 | Furusawa | |
| 2005/0074963 A1* | 4/2005 | Fujii et al. | 438/623 |
| 2005/0122351 A1* | 6/2005 | Yamazaki et al. | 347/5 |
| 2007/0057258 A1* | 3/2007 | Fukuchi et al. | 257/61 |
| 2007/0102818 A1 | 5/2007 | Sasaki et al. | |
| 2007/0131976 A1* | 6/2007 | Kanno et al. | 257/223 |

FOREIGN PATENT DOCUMENTS

| | | |
|---|---|---|
| EP | 1063693 | 12/2000 |
| EP | 1355522 | 10/2003 |
| GB | 2211992 | 7/1989 |
| JP | 02-000025 | 1/1990 |
| JP | 06-275645 | 9/1994 |
| JP | 07-312290 | 11/1995 |
| JP | 09-102727 | 4/1997 |
| JP | 11-112001 | 4/1999 |
| JP | 2000-206509 | 7/2000 |
| JP | 2003-058077 | 2/2003 |
| JP | 2003-126760 | 5/2003 |
| JP | 2003-234355 | 8/2003 |

OTHER PUBLICATIONS

Written Opinion (Application No. PCT/JP2004/016809; PCT7498) Dated Mar. 1, 2005.

* cited by examiner

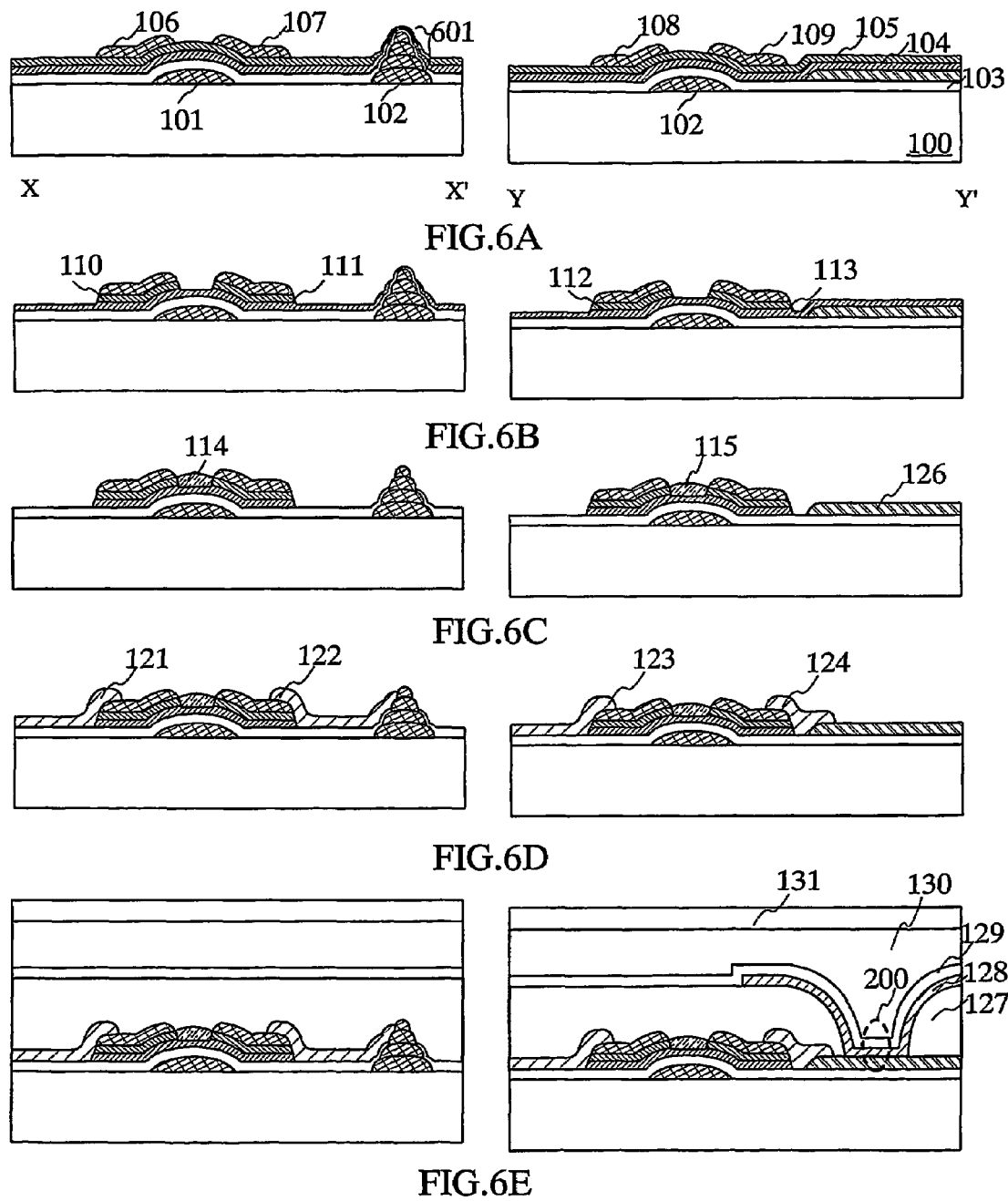

X                                    X'  Y                                        Y'

↓ drying and baking

⇩ baking in the atmosphere containing oxygen or oxygen plasma treatment movement of a substrate

LIGHT-EMITTING DEVICE AND METHOD FOR MANUFACTURING THE SAME

BACKGROUND OF THE INVENTION

1. Technical Field

The present invention relates to a semiconductor element using droplet discharging as typified by ink jetting, and a method for manufacturing the same. More particularly, the present invention relates to a semiconductor element that is used for a light-emitting device as typified by an electroluminescent display device, and a method for manufacturing the same.

2. Background Art

In manufacturing a semiconductor element, it has been considered the possibilities of using a droplet discharge device for forming a pattern of a thin film or a wiring, each of which is used for a semiconductor element, to reduce costs for equipment and to simplify a manufacturing process.

In this instance, various wirings such as a gate electrode, a scanning line, a signal line, and a pixel electrode for forming a semiconductor element are formed according to the procedure, that is, a composite formed by dissolving or dispersing a conductive material into a solvent is discharged from a nozzle of a droplet discharge device above a substrate or a film so that such the various wirings are formed by being directly drawn. (See Japanese Unexamined Patent Publication No. 2003-126760).

To manufacture a semiconductor element such as a thin film transistor (TFT) that is used for a light-emitting device as typified by an active matrix electroluminescent display device, it has been required to establish a structure and a process that are most appropriate to droplet discharging and that are different from a TFT manufactured by conducting repeatedly a film formation process, a patterning process, and an etching process. It has been required to simplify the structure and the process of a semiconductor element manufactured by droplet discharging with the increase in the size of a TFT substrate, for example, a substrate of more than 1×1 m or twice or three times as large as that.

Especially in case that a light-emitting element composed of layers containing organic compounds or inorganic compounds (typically, a light-emitting element utilizing electroluminescence) is driven by a TFT, a structure having at least two transistors installed with a drive TFT is required to prevent irregularities of ON current of a switching TFT provided to a pixel region. Accordingly, the simplification of a structure and a process for manufacturing a semiconductor element becomes an urgent task as a large substrate is frequently used.

The foregoing light-emitting element is composed of laminated light-emitting layers containing an organic compound or an inorganic compound, each of which has a different carrier transporting property, interposed between a pair of electrodes. Holes are injected from the electrode and electrons are injected from another electrode. The light-emitting element utilizes the phenomenon that holes injected from the electrode and electrons injected from another electrode are recombined with each other to excite an emission center, and excited molecules radiate energy as light while returning to the ground state. FIG. 1B shows a circuit structure of a pixel in the case that a light-emitting element is formed by stacking layers sequentially. When a light-emitting element is formed by stacking layers sequentially, a pixel electrode of a drive TFT 1602 serves as a hole injecting electrode (anode).

Reference numeral 1601 in FIG. 1B denotes a switching TFT for controlling ON/OFF of current flowing in a pixel. As illustrated in FIG. 1B, a drain wiring (or a source wiring) of a switching TFT 1601 is connected to a gate electrode layer of the drive TFT 1602. Since a gate insulating film or a semiconductor layer are presented between the gate electrode layer, and the source or the drain wiring (hereinafter, referred to as gate-drain), a gate electrode layer 1609 of the drive TFT 1602 is required to connect to a drain wiring 1608 of a switching TFT 1601 via an opening portion 1610 such as a contact hole (FIG. 1A). Accordingly, there has been a problem of a complicated process and a decrease in throughput and yields. Further, in case that a light-emitting element is formed by stacking layers inversely (in case that a pixel electrode of the drive TFT 1602 serves as an electron injecting electrode (cathode)) (FIG. 2), similar problem has been arisen.

In order to solve the foregoing problem, it is an object of the present invention to provide a structure of a semiconductor element, which is used for a light-emitting device, and which has proper conditions to be actively formed by droplet discharging; and a simplified method for manufacturing the semiconductor element. According to the present invention, the high throughput manufacture of a high stable semiconductor element over various sized substrates can be realized in high yields for reduced tact time can be realized.

The followings are aspects of the present invention to solve the foregoing problems.

One configuration of the present invention provides a light-emitting device, which comprises: per pixel of the light-emitting device, at least a semiconductor element for switching and a semiconductor element for driving; wherein the semiconductor element for switching and the semiconductor element for driving element, which comprises: a layer containing titanium or a titanium oxide formed over a substrate; a gate electrode layer formed over the layer; a gate insulating film formed over the gate electrode layer; a semiconductor film formed over the gate insulating film; a source electrode and a drain electrode formed over the semiconductor film; and an insulating film formed above a portion serving as a channel region in the semiconductor film; wherein the source electrode or the drain electrode of the semiconductor element for switching is connected to the gate electrode layer of the semiconductor element for driving.

According to one aspect of the present invention, at least a portion provided with a gate electrode layer in a substrate is pretreated before forming a gate electrode layer over the substrate. As the pretreatment, the formation of a layer containing titanium, titanium oxide, or the like; the formation of a film formed by polyimide, acrylic, or a material which has a skeleton formed by the bond of silicon (Si) and oxygen (O), and which includes at least hydrogen as a substituent, or at least one selected from the group consisting of fluoride, alkyl group, and aromatic hydrocarbon as the substituent; plasma treatment; or the like can be nominated. The plasma treatment is preferably conduced in atmospheric pressure.

Another configuration of the present invention provides the insulating film is preferably formed to have a thickness of 100 nm or more, more preferably, 200 nm or more, to serve as a channel protecting film. Further, the insulating film may be formed to have a laminated-layer structure. For example, a bottom layer may be formed by a film that can be formed by CVD or sputtering such as a silicon nitride film, and a top layer may be formed by a film that can be formed by droplet discharging, for example, polyimide, acrylic, or heat resistant resin such as siloxane. Alternatively, both layers may be formed by films that can be formed by droplet discharging. The semiconductor film provided with the insulating film is preferably formed to have a thinner thickness than that of another semiconductor film. Further, to obtain enough large channel mobility, the semiconductor film provided with the insulating film is preferably formed to have a thickness of 5 nm or more, preferably, 10 nm or more, more preferably, 50 nm or more.

More another configuration of the present invention provides a column-like conductor (also referred to as a pillar, plug, or the like) that is preliminarily formed over a gate electrode layer of a drive TFT that is required to be provided with a contact hole.

Still more another configuration of the present invention provides a method for manufacturing a light-emitting device having, per pixel of the light-emitting device, at least a semiconductor element for switching and a semiconductor element for driving, which comprises the steps of: for forming the semiconductor element for switching and the semiconductor element for driving, forming a gate electrode layer by discharging a composite containing a first conductive material over a substrate; forming a gate insulating film over the gate electrode layer; forming a semiconductor film over the gate insulating film; forming a semiconductor film containing an impurity element having a conductivity type over the semiconductor film; forming a source electrode and a drain electrode by discharging a composite containing a second conductive material over the semiconductor film containing an impurity element having a conductivity type; forming a source region and a drain region by removing a part of the semiconductor film containing an impurity element having a conductivity type using the source electrode and the drain electrode as a mask; forming an insulating film above a portion serving as a channel region in the semiconductor film; forming an island-like semiconductor film by removing a part of the semiconductor film using the source electrode, the drain electrode, and the insulating film as a mask; wherein a contact hole is formed by removing at least a part of the gate insulating film over the gate electrode layer of the semiconductor film for driving; and a wiring for connecting the source electrode or the drain electrode to the gate electrode layer of another semiconductor film by discharging a composite containing a third conductive material via the contact hole.

That is, the gate electrode layer is formed by droplet discharging over the substrate; the gate insulating film, the semiconductor film, the semiconductor film containing an impurity element of a single conductivity type (hereinafter, single conductivity semiconductor film) are stacked by a thin film formation method such as CVD or sputtering; and a source electrode and a drain electrode are formed by droplet discharging. Then, the source region and the drain region are formed by removing the exposed single conductivity semiconductor film by etching or the like using the source electrode and the drain electrode as a mask. And then, an insulating film capable of being formed by droplet discharging or the like is formed thereover to cover to prevent the portion serving as a channel region of the semiconductor film from removing. In addition, the insulating film serves as a channel protecting film. An island-like semiconductor film is formed by removing the exposed semiconductor film by etching or the like using the source electrode, the drain electrode, and the insulating film as masks. Through the foregoing process, a semiconductor element that seems like a channel protective type apparently can be obtained. Moreover, a desired liquid crystal display device or a light-emitting device can be obtained by providing a light-emitting element using a liquid crystal element, organic electroluminescent element, or the like, and connecting a pixel electrode to the source electrode or the drain electrode.

According to another aspect of the present invention, at least a portion provided with a gate electrode layer in a substrate is pretreated before discharging a composite containing a first conductive material over the substrate. As the pretreatment, the formation of a layer containing titanium, titanium oxide, or the like; the formation of a film formed by polyimide, acrylic, or a material which has a skeleton formed by the bond of silicon (Si) and oxygen (O), and which includes at least hydrogen as a substituent, or at least one selected from the group consisting of fluoride, alkyl group, and aromatic hydrocarbon as the substituent; plasma treatment; or the like can be nominated. The plasma treatment is preferably conducted in atmospheric pressure.

According to more another aspect of the present invention, a source region and a drain region are formed; a first insulating film is formed over the source electrode and the drain electrode by CVD or sputtering; a second insulating film is formed over the first insulating film and above the portion serving as a channel region in the semiconductor film; and an insulating film serving as a channel protective film is formed to have a two-layered structure. The second insulating film serves as not only a channel protective film but also a mask for removing a first protective film formed all over a substrate by CVD or the like. As the first insulating film, an insulating film containing silicon, preferably, a silicon nitride film is used. As the second insulating film, any insulating film can be used as long as it can be selectively formed by droplet discharging. Preferably, a film formed by polyimide; acrylic; or a substance which has a skeleton formed by the bond of silicon (Si) and oxygen (O), and which includes at least hydrogen as a substituent, or at least one selected from the group consisting of fluoride, alkyl group, and aromatic hydrocarbon as the substituent can used as the second insulating film. The insulating film is not limited to a two-layered structure; the film can be formed to have a three or more-layered structure.

A substance, which has a skeleton formed by the bond of silicon (Si) and oxygen (O), and which includes at least hydrogen as a substituent, or at least one selected from the group consisting of fluoride, alkyl group, and aromatic hydrocarbon as the substituent is referred to as siloxane based resin. The siloxane based resin is a kind of a heat resistant planarized film or a heat resistant interlayer (HRIL) film. Hereinafter, the term "heat resistant planarized film", "heat resistant interlayer film", "heat resistant resin", or "HRIL" includes the siloxane based resin.

As droplet discharging for forming the conductive material or the insulating film, not only ink jetting but also offset printing or screen-printing can be used depending on the property of a film to be formed.

Conventionally, a source region and a drain region were formed by etching off a single conductivity semiconductor film after forming the island-like semiconductor film. Accordingly, it was necessary to provide a resist mask when forming an island-like semiconductor film. On the contrary, according to the present invention, after that a source region and a drain region are formed, an insulating film serving as a channel protective film is formed to cover a portion for serving as a channel region, then, an island-like semiconductor film is formed. Accordingly, a resist mask is not required to be provided, and so the process can be simplified. As discussed above, the present invention provides a novel means for forming a semiconductor element by combining a method for removing a single conductivity semiconductor film using a metallic mask of a source electrode and a drain electrode to form a source region and a drain region, and a method, which is specific to a channel protective type, for forming a channel protective film to prevent a channel region from removing. According to the foregoing configuration of present invention, a semiconductor element can be manufactured by using only a metallic mask of a source electrode and a drain electrode without using any resist mask.

Before discharging a composite containing a first conductive material over a substrate, a pretreatment such as the formation of a titanium oxide (TiOx) or the like may be conducted at least over the portion provided with a gate electrode layer over the substrate. Accordingly, the adhesiveness between the substrate and a conductive film such as the gate electrode layer formed by droplet discharging can be improved.

The gate electrode layer of the drive TFT can be connected to the drain electrode of the switching TFT without forming a contact hole by forming a pillar over the gate electrode layer of the drive TFT in connecting the gate electrode layer of the drive TFT to the drain electrode of the switching TFT.

The gate electrode layer of the drive TFT can be connected to the drain electrode of the switching TFT in accordance with the procedure, that is, a contact hole is formed by using a wiring formed by droplet discharging as a mask in connecting the gate electrode layer of the drive TFT to the drain electrode of the switching TFT; and the contact hole is filled with conductor.

By forming a semiconductor film provided with the insulating film to have a thinner thickness than that of another semiconductor film, an n-type impurity region can be divided into a source region and a drain region completely. By forming the semiconductor film provided with the insulating film to have a thickness of 10 nm or more, enough large channel mobility can be obtained.

By forming the insulating film to have a thickness of 100 nm or more, the function as a channel protective film can be improved and the channel region can be surely prevented from damaging. Accordingly, a stable semiconductor element having high mobility can be provided. Further, to obtain the foregoing advantage, it is effective that the insulating film is formed to have a two-layer structure composed of a first insulating film and a second insulating film, or three or more layered structure.

DISCLOSURE OF THE INVENTION

A light-emitting device according to the present invention and a method for manufacturing the light-emitting device are explained with reference to FIGS. 3A to 3E. FIGS. 3A to 3E show cross-sectional structures of FIG. 1A or FIG. 2A taken along line X-X' (at the side of a switching TFT), and Y-Y' (at the side of a drive TFT).

A so-called photocatalytic substance such as titanium (Ti), or a titanium oxide (TiOx); polyimide, acrylic, or heat resistant resin such as siloxane is formed over a substrate 100 at least over a portion provided with a gate electrode layer in a substrate 100. Here, a titanium oxide film 132 is formed. Alternatively, plasma treatment can be carried out. Such pretreatment results to improve the adhesiveness between the substrate 100 and a conductive film (herein gate electrode layers 101 and 102) formed by discharging a composite containing a conductive material. In case of forming a titanium oxide, light-transmittance can be improved. The titanium oxide may be directly formed, or can be formed by baking the conductive film after forming a titanium film. Besides the titanium or the titanium oxide, a photocatalytic substance such as strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), ferric oxide ($Fe_2O_3$), or tungsten oxide ($WO_3$), or the like can be formed. The foregoing pretreatment is carried out as much as possible to improve the adhesiveness between the substrate and the conductive film.

In case of carrying out the pretreatment with the surface of the substrate 100, a gate electrode layer 101 of a switching TFT and a gate electrode layer 102 of a drive TFT are formed by discharging a composite containing a first conductive material above the pre-treated portion. Here, the gate electrode layer refers to a layer formed by a single layered or multiple layered conductors including at least a gate electrode portion of a TFT. The gate electrode layers 101, 102 are formed by discharging the composite; and drying the composite at 100° C. for three minutes; then, baking the composite under nitride or oxide atmosphere at 200 to 350° C. for 15 to 30 minutes. However, it is not limited to the foregoing condition.

As the first conductive material, various materials depending on the function of the conductive film can be used. As typical examples are silver (Ag), copper (Cu), gold (Au), nickel (Ni), platinum (Pt), chrome (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), zinc (Zn), iron (Fe), titanium (Ti), silicon (Si), germanium (Ge), zirconium (Zr), barium (Ba), antimony lead, tin oxide antimony, fluoride doped zinc oxide, carbon, graphite, glassy carbon, lithium, beryllium, natrium, magnesium, potassium, calcium, scandium, manganese, zirconium, gallium, niobium, sodium, sodium-potassium alloys, magnesium-copper mixtures, magnesium-silver mixtures, magnesium-aluminum mixtures, magnesium-indium mixtures, aluminum-aluminum oxide mixtures, lithium-aluminum mixtures, or the like, or particles or the like such as silver halide, or dispersible nanoparticles; or indium tin oxide (ITO) used as a conductive film, zinc oxide (ZnO), gallium zinc oxide (GZO) composed of zinc oxide doped with gallium, indium tin oxide (IZO) composed of indium oxide mixed with 2 to 20% of zinc oxide, organic indium, organic tin, titanium nitride, or the like which are used as a conductive film can be used.

Silicon (Si) or silicon oxide (SiOx) may be contained in the foregoing conductive material, especially in case that the foregoing material is used for forming a transparent conductive film. For example, a conductive material composed of ITO containing silicon, silicon oxides, or silicon nitride (hereinafter, ITSO) can be used. Further, a desired conductive film may be formed by stacking layers formed by these conductive materials.

The diameter of a nozzle used for a droplet discharging means is set from 0.1 to 50 μm (preferably, 0.6 to 26 μm), and the discharge quantity of a composite discharged from a discharge opening is set from 0.00001 to 50 pl (preferably, 0.0001 to 10 pl). The discharge quantity is increased with an increase in the diameter of a nozzle. A subject and a discharge opening of a nozzle are preferably close to each other as much as possible to deliver drops at a desired portion. The distance between the subject and the discharge opening is preferably set approximately from 0.1 to 2 mm.

In consideration with the specific resistance value, the composite discharged from a discharge opening is preferably formed by dissolving or dispersing a material of gold, silver, or copper in a solvent. More preferably, low resistant silver or copper may be used. In case of using copper, a barrier film is preferably provided together as a countermeasure against impurities. As the solvent, esters such as butyl acetate or ethyl acetate; alcohols such as isopropyl alcohol or ethyl alcohol; an organic solvent such as methyl ethyl ketone or acetone; or the like can be used. As the barrier film in case of using copper as a wiring, a substance including nitrogen with an insulating property or a conducting property such as silicon nitride, silicon oxynitride, aluminum nitride, titanium nitride, or tantalum nitride (TaN) may be used to form the barrier film by droplet discharging.

A composite used for droplet discharging has preferably viscosity of 300 mPa·s or less to prevent desiccation and to be discharged smoothly from a discharge opening. The viscosity, the surface tension, or the like of a composite may be controlled depending on a solvent or application. As an example, a composite formed by dissolving or dispersing ITO, ITSO, organic indium, and organic tin in a solvent has viscosity of from 5 to 50 mPa·s, a composite formed by dissolving or dispersing silver in a solvent has viscosity of from 5 to 20 mPa·s, and a composite formed by dissolving or dispersing gold in a solvent has viscosity of from 10 to 20 mPa·s.

The diameter of a particle of a conductive material is preferably small, preferably 0.1 μm or less to prevent clogging and to manufacture a high-definition pattern although it depends on the diameter of each nozzle, a desired pattern form, or the like. A composite is formed by a known method such as an electrolytic method, an atomization method, or a wet-reduction method to have a grain diameter of from approximately 0.5 to 10 μm. In case that the composite is formed by a gas evaporation method, a nano molecule protected by a dispersing agent has a minute diameter of approximately 7 nm. Further, the nano particle whose surface is covered by a film-forming agent can be stably dispersed in a solvent without aggregation at room temperature, which shows just like the behavior of liquid. Therefore, a film-forming agent is preferably used.

Alternatively, a gate electrode layer may be formed by discharging a composite containing a particle in which a material of a single conductivity type covered by another conductive material. In this instance, a buffer layer is preferably provided between both of the conductive materials. For example, The particle formed by covering Cu by Ag may have the structure in which a buffer layer of Ni or NiB (nickel boron) is provided between the Cu and Ag.

By using actively a gas mixed with oxygen of 10 to 30% in a division pressure ratio in a process for baking a composite containing a conductive material, the resistivity of a conductive film for forming the gate electrode layer can be reduced, and the conductive film can be formed into a thin and smooth film. An outline of the state of changes in a conductive film through a process of baking is given with reference to FIGS. 16A to 16C. FIG. 16A shows the state that nano paste 502 containing a conductive material such as Ag is discharged over a glass substrate 500 by a nozzle 501. The nano paste is formed by dispersing or dissolving a conductive material into an organic solvent. Besides, a dispersing agent or thermosetting resin referred to as binder is also contained in the organic solvent. Especially, the binder can prevent the nano paste from being cracked and being unevenly baked. By the drying and the baking processes, the organic solvent is evaporated, and a dispersing agent is decomposed to be removed, then, the nano paste is cured and contracted due to the binder, simultaneously. Accordingly, nano particles are fused with each other to cure the nano paste. On this occasion, the nano particles are grown to a size of from several ten to hundred several ten nm, and the adjoining growing nano particles are welded and linked together to form metal chains. On the other hand, almost the left organic ingredients (approximately 80 to 90%) are pushed out to the outside of the metal chains. As a result, a conductive film containing metal chains 503 and a film formed by the organic ingredients 504 covering the surface are formed (FIG. 16B). In baking the nano paste 502 in the presence of nitrogen and oxygen, the film formed by organic ingredients 504 can be removed by the reaction of the oxygen in the gas and carbon, hydrogen, or the like contained in the film formed by organic ingredients 504. In case that oxygen is not contained in the baking atmosphere, the film formed by organic ingredients 504 can be removed by oxygen plasma treatment or the like (FIG. 16C). As discussed above, the film formed by organic ingredients 504 is removed in accordance with the procedure, that is, the nano paste is baked or dried in the presence of nitrogen and oxygen, and oxygen plasma treatment is carried out. Therefore, the conductive film containing metal chains 503 can be formed into a thin and smooth film, and reduced its resistivity.

Further, a solvent in a composite volatilizes by discharging the composite containing a conductive material under reduced pressure, and so the time for the subsequent heat treatment (drying or baking) can be reduced.

In addition to the above-mentioned drying and baking process, treatment for flattening and smoothing the surface can be carried out. As the treatment, CMP (chemical mechanical polishing); or a method for flattening the conductive film by etching after forming an insulating film having a planarization property over the conductive film (referred to as etched back method).

As the substrate, a substrate formed by an insulator such as a glass substrate, a quartz substrate, or alumina; a plastic substrate having heat resistance capable of resisting process temperature in the subsequent treatment; or the like can be used. In this instance, a base insulating film for preventing impurities from diffusing from a substrate such as a silicon oxide (SiOx), a silicon nitride (SiNx), a silicon oxynitride (SiOxNy) (x>y), silicon nitride oxide (SiNxOy) (x>y), or the like, (x, y=1, 2 . . . ) may be formed. Alternatively, a metal such as stainless, or a semiconductor substrate provided with an insulating film such as a silicon oxide or a silicon nitride can be used.

A gate insulating film 103 is formed over the gate electrode layer. The gate insulating layer is formed by a film containing a silicon nitride, a silicon oxide, a silicon nitride oxide, or a silicon oxynitride in a single layer or a laminated-layer by a thin film forming method such as plasma CVD, sputtering, or the like. Here, a silicon oxide film, a silicon nitride film, and a silicon oxide film are formed as a three-layered structure sequentially over a substrate. However, it is not limited to the structure, the material, and the method.

A semiconductor film 104 is formed over the gate insulating film 103. The semiconductor film is formed by an amorphous semiconductor, a crystalline semiconductor, or a semiamorphous semiconductor. As these semiconductors, a semiconductor film containing silicon, silicon germanium (SiGe), or the like as its main component can be used. The semiconductor film can be formed by plasma CVD. Preferably the semiconductor film has a thickness of from 10 to 100 nm.

Among the foregoing semiamorphous semiconductors, an SAS (semiamorphous silicon) is briefly explained. The SAS can be obtained by grow discharge decomposition of a silicide gas. As a typical silicide gas, $SiH_4$ can be used. Other silicide gas such as $Si_2H_6$, $SiH_2Cl_2$, $SiHCl_3$, $SiCl_4$, $SiF_4$, or the like can be used. The SAS can be formed easily by diluting the silicide gas with one kind or a plurality of kinds of a rare gas element selected from the group consisting of hydrogen, hydrogen and helium, argon, krypton, and neon. The dilution rate is preferably in the range of from 10 to 1000 times. Of course, a reaction product for forming a film is formed by grow discharge decomposition at a reduced pressure in the range of approximately from 0.1 to 133 Pa. High frequency power of from 1 to 120 MHz, preferably, from 13 to 60 MHz may be supplied to form the grow discharge. A temperature for heating a substrate is preferably 300° C. or less, more preferably, from 100 to 200° C.

An energy band width may be controlled to be from 1.5 to 2.4 eV, or from 0.9 to 1.1 eV by mixing a carbide gas such as $CH_4$ or $C_2H_6$, or a germanium gas such as $GeH_4$ or $GeF_4$ into the silicide gas.

The SAS shows weak n-type electrical conductivity when impurities are deliberately not doped to control a valency electron. This arises from the fact that oxygen is easily mixed into a semiconductor film since grow discharge at higher electricity is carried out than that for forming an amorphous semiconductor. Therefore, it becomes possible that a threshold value can be controlled by doping p-type impurities into the first semiconductor film provided with a channel formation region for a TFT simultaneously or after the formation of the film. As impurities imparting p-type, boron can be typically used. An impurity gas of from 1 to 1000 ppm such as $B_2H_6$ or $BF_3$ may be mixed into a silicide gas. In case that boron is used as impurities imparting p-type, the boron may have a concentration of from $1 \times 10^{14}$ to $6 \times 10^{16}$ atoms/cm$^3$. By forming a channel formation region by the foregoing SAS, electron field-effect mobility of from 1 to 10 cm$^2$/V·sec can be obtained.

A crystalline semiconductor film can be obtained in accordance with the following procedure, that is, an amorphous semiconductor film is treated in a solution containing catalyst such as nickel; heat crystallization treatment is carried out at 500 to 750° C. to obtain a crystalline silicon semiconductor film; and laser crystallization is carried out to improve the crystallinity.

The crystalline semiconductor film can be obtained by forming directly a poly-crystalline semiconductor film by LPCVD (low pressure CVD) using a material gas of disilane ($Si_2H_6$) and fluoride germanium ($GeF_4$). The LPCVD is carried out in the conditions, but not exclusively, that is, a gas flow ratio of $Si_2H_6/GeF_4=20/0.9$, a film forming temperature of from 400 to 500° C., and a carrier gas of He or Ar.

An n-type semiconductor film 105 is formed over a semiconductor film. As an n-type impurity element, arsenic (Ar) and phosphorus (P) can be used. In case of forming an n-type semiconductor film, an n-type (n+) silicon film can be formed by the grow discharge decomposition of a mixed gas of $SiH_4$, $H_2$, and $PH_3$ (phosphine) using plasma CVD. Instead of the n-type semiconductor film 105, a semiconductor film containing p-type impurity elements such as boron (B) can be formed.

Source electrodes or drain electrodes 106 to 109 are formed by discharging a composite containing a second conductive material over the n-type semiconductor film 105. The second conductive material, a conductive particle structure, a discharge condition, a drying condition, a baking condition, or the like can be appropriately selected from those explained in the foregoing first conductive material. Further, the first and the second conductive materials and the first and the second particle structures may be the same or different. (FIG. 3A)

The denotation of a source region, a drain region, and an electrode included in a TFT is changed depending on the polarity of the TFT. In this specification, a source region, a drain region, and the like are denoted for descriptive purposes.

Although not shown, pretreatment for improving the adhesiveness between the n-type semiconductor film 105 and the source electrode 108, and the adhesiveness between the n-type semiconductor film 105 and the drain electrode 109 may be conducted before discharging the composite containing the second conductive material over the n-type semiconductor film 105. The pretreatment may be conducted similar to the way the pretreatment for forming the gate electrode 102.

Source regions or drain regions 110 to 113 are formed by etching the n-type semiconductor film 105 using the source electrodes or the drain electrodes 106 to 109 as masks. Here, plasma etching is adopted with an etching gas of a chlorine gas such as $Cl_2$, $BCl_3$, $SiCl_4$, or $CCl_4$; a fluoride gas such as $CF_4$, $SF_6$, $NF_3$, or $CHF_3$; or $O_2$. However, it is not limited to the conditions. The etching can be carried out by using atmospheric plasma. In this instance, a mixed gas of $CF_4$ and $O_2$ is preferably used as an etching gas. In case that the n-type semiconductor, film 105 and the semiconductor film 104 are formed by the same semiconductor, attention needs to be paid to an etching rate and an etching time since the semiconductor film 104 is etched together when the n-type semiconductor film 105 is etched. However, enough mobility as a TFT can be obtained even if a part of the semiconductor film 104 is etched in case that a semiconductor film at a channel forming region is formed to have a thickness of 5 nm (50 Å) or more, preferably, 10 nm (100 Å) or more, more preferably, 50 nm (500 Å) or more as shown in FIG. 3B.

Insulating films 114, 115 are formed by droplet discharging above the channel region of the semiconductor film 104. Since the insulating films 114, 115 serve as a channel protective film, a composite of heat resistant resin such as siloxane, or a substance having etching resistivity and insulating property such as acrylic, benzocyclobutene, polyamide, polyimide, benzimidazole, or polyvinyl alcohol is selected as a discharged composite. Siloxane and polyimide are preferably used. To prevent the channel region from being overetched, the insulating film 114 and 115 is formed to have a thickness of 100 nm or more, preferably 200 nm or more. (FIG. 3B) Therefore; although not shown, the insulating films 114 and 115 may be formed into like a mound over the source electrodes or the drain electrodes 106 to 109.

Then, an island-like semiconductor films 116 and 118 are formed by plasma etching the semiconductor film 104 using the source electrodes or the drain electrodes 106 to 109, and the insulating film 115 as masks. Here, plasma etching is adopted with an etching gas of a chlorine gas such as $Cl_2$, $BCl_3$, $SiCl_4$, or $CCl_4$; a fluoride gas such as $CF_4$, $SF_6$, $NF_3$, or $CHF_3$; or $O_2$. However, it is not limited to the conditions. The etching can be carried out by using atmospheric plasma. In this instance, a mixed gas of $CF_4$ and $O_2$ is preferably used as an etching gas. Further, since the insulating films 114 and 115 are formed above the channel regions 117 and 119 in the island-like semiconductor films 116 and 118, the channel region 117 and 119 is not damaged due to overetching in the foregoing etching process. Hence, a channel protective type TFT (channel stopper type) having stable characteristics and high mobility can be manufactured without any resist mask.

Source wirings or drain wirings 121 to 124 are formed by discharging a composite containing a third conductive material so as to be in contact with the source electrodes or drain electrodes 106 to 109. A wiring 120 is formed simultaneously with forming the source wirings or drain wirings 121 to 124. The wiring 120 serves as a mask for forming a contact hole of gate-drain, or serves as a wiring of the gate-drain. In case that the pixel electrode 126 is formed after forming the gate insulating film 103 as shown in FIGS. 3A to 3E, a composite is discharged so that the source wirings or the drain wirings of the drive TFT are connected to the pixel electrode 126. Here, in case of forming a light-emitting element by stacking layers sequentially, the pixel electrode 126 serves as a hole injecting electrode (anode) and the wiring 124 serves as a source wiring. On the other hand, in case of forming a light-emitting element by stacking layers inversely, the pixel electrode 126 serves as an electron injecting electrode (cathode) and the wiring 124 serves as a drain wiring.

The pixel electrode 126 may be formed after forming the source wiring or the drain wiring as shown in FIG. 8. FIGS. 8A to 8E show the right side diagram is a cross-sectional structure at the side of a drive TFT and the left side diagram is a cross-sectional structure at the side of a switching TFT.

The third conductive material, a conductive particle structure, a discharge condition, a drying condition, a baking condition, or the like can be appropriately selected from those explained in the foregoing first conductive material. Further, the second and the third conductive materials, and the second and the third particle structures may be the same or different. The pixel electrode is preferably formed by droplet discharging. As a material for the pixel electrode, a transparent conductive film such as ITO, ITSO, ZnO, GZO, IZO, organic indium, or organic tin is preferably used. (FIG. 3C)

Although not shown, pretreatment for improving the adhesiveness with the bottom layer can be carried out in forming the source wirings or the drain wirings 121 to 124, and the pixel electrode 126. The pretreatment can be conducted similar to the way of the pretreatment for forming the gate electrode layers 101 and 102.

A contact hole is formed by etching off the gate insulating film 103 at the side of a switching TFT using the wirings 120, 122 as masks. Plasma etching is carried out with an etching gas of a chlorine gas such as $Cl_2$, $BCl_3$, $SiCl_4$, or $CCl_4$; a fluoride gas such as $CF_4$, $SF_6$, $NF_3$, or $CHF_3$; or $O_2$. However, it is not limited to the condition. Further, the etching can use atmospheric plasma. Thereafter, a composite containing a fourth conductive material is discharged to fill the contact hole and to form a conductor 125 for connecting the gate-drain. In addition, the third conductive material, a conductive particle structure, a discharge condition, a drying condition, a baking condition, or the like can be appropriately selected from those explained in the foregoing first conductive material. Further, the third and the fourth conductive materials and the third and the fourth particle structures may be the same or different. (FIG. 3D)

A partition wall 127 (referred to as an embankment, bank, or the like) formed by an organic resin film or an inorganic insulating film is selectively formed by droplet discharging over the pixel electrode 126. As the partition wall, heat resistant resin such as siloxane or resin such as polyimide or acrylic is preferably used. Especially, by using siloxane, the subsequent baking process can be carried out at high temperature to remove sufficiently moisture that has an adverse affect on an electroluminescent element. The partition wall 127 is selectively formed to have an opening portion. The pixel electrode 126 is exposed by the opening portions.

Then, a layer containing an organic compound (also referred to as electroluminescent layer, hereinafter, "organic compound layer 128") is formed so as to be in contact with the pixel electrode 126 at an opening of the partition wall 127. The organic compound layer 128 may be formed by a single layer or a laminated-layer. For example, the organic compound layer 128 may have the configuration of a laminated-layer in the case of being seen from the side of a semiconductor element (the side of a pixel electrode): 1) anode\hole injecting layer\hole transporting layer\light-emitting layer\electron transporting layer\cathode, 2) anode\hole injecting layer\light-emitting layer\electron transporting layer\cathode, 3) anode\hole injecting layer\hole transporting layer\light-emitting layer\electron transporting layer\electron injecting layer\cathode, 4) anode hole injecting layer\hole transporting layer\light-emitting layer\hole blocking layer\electron transporting layer\cathode, 5) anode\hole injecting layer\hole transporting layer\light-emitting layer hole blocking layer\electron transporting layer\electron injecting layer\cathode, or the like. In the case that the light-emitting element is formed to have the foregoing configurations, the light-emitting element is formed by stacking layers sequentially. In this instance, the pixel electrode 126 serves as an anode. On the other hand, in the case that the light-emitting element is formed to have the configuration in which a cathode is firstly stacked when being seen from the side of a cathode semiconductor element (the side of a pixel electrode), the light-emitting element is formed by stacking layers inversely. In this instance, the pixel electrode 12 serves as a cathode.

An electron injecting electrode 129 (cathode) is formed to cover the organic compound layer 128 in case of forming a light-emitting element by stacking layers sequentially. In case of a light-emitting element is formed by stacking layers inversely, an anode is formed. The electron injecting electrode 129 can be formed by a known material having a small work function such as Ca, Al, CaF, MgAg, AlLi, or the like. A light-emitting element 200 is formed by overlapping the pixel electrode 126 (here, anode), the organic compound layer 128, and the electron injecting electrode 129 at the opening portion of the partition wall 127. (FIG. 3E)

Moreover, the light-emitting element is preferably packaged so as not to be exposed to the air by an airtight protecting film that is hardly degassed (laminate film, ultraviolet curable resin film, or the like) or cover material. Here, a passivation film 130 is formed to seal the light-emitting element by an opposing substrate 131 (FIG. 3E).

As noted above, according to the present invention, after the source regions or the drain regions 110 to 113 are formed, the portion serving as a channel region is covered by the insulating films 114 and 115 serving as a channel protecting film to form the island semiconductor film. Accordingly, a resist mask is not required, and so the process can be simplified. The present invention provides a novel means for forming a semiconductor element by combining a method, which is specific to a channel etch type, for removing a single conductivity semiconductor film using a metallic mask of a source electrode and a drain electrode to form a source region and a drain region, and a method, which is specific to a channel protective type, for forming a channel protective film to prevent a channel region from removing. A semiconductor element can be manufactured by using only a metallic mask of a source electrode and a drain electrode without using any resist mask according to the foregoing structure. As a result, the process can be simplified, and the costs can be drastically reduced by the saving of materials. The manufacture of a high stable semiconductor element that is used for a light-emitting device can be realized at low costs at high throughput with high yields for a reduced tact time especially in case that a substrate of more than 1×1 m or a twice or three times as large as that is used.

For connecting the gate-drain with each other, a contact hole is formed by using a wiring mask, and the contact hole is filled with a conductor. Accordingly, the gate-drain can be connected with each other without a resist mask.

Since at least a portion provided with a gate electrode layer over a substrate of the semiconductor element according to the present invention is treated with the formation of a titanium oxide film or the like, the adhesiveness between a substrate and a conductive film formed by droplet discharging such as a gate electrode layer can be improved.

The semiconductor film provided with the insulating film is preferably formed to have a thinner thickness than that of another semiconductor film to divide surely the n-type impurity region into a source region and a drain region. Further, to obtain enough large channel mobility, the semiconductor film of a portion provided with the insulating film is preferably formed to have a thickness of 5 nm or more, preferably 10 nm or more.

In the semiconductor element according to the present invention, the insulating films 114 and 115 serving as a channel protective film is formed over the channel regions 117 and 119, accordingly, the channel regions 117 and 119 are not damaged due to overetching in etching the semiconductor film 104. Therefore, the semiconductor element has stable characteristics and high mobility. By forming the insulating film to have a thickness of 100 nm or more, the function of the insulating film as a channel protective film can be surely improved to prevent damages of the channel region. Therefore, a stable semiconductor element having high mobility can be obtained. To obtain the foregoing advantages, it is effective that the insulating film can be formed to have a two-layered structure composed of the first insulating film and the second insulating film, or a multi-layered structure composed of three or more layers.

BRIEF DESCRIPTION OF THE DRAWINGS

FIGS. 6A to 6E are schematic views for showing a manufacturing process of a light-emitting device according to the present invention;

BEST MODE FOR CARRYING OUT THE INVENTION

Embodiment 1

In Embodiment 1, the case that a substrate is pretreated before forming a gate electrode layer thereover is explained.

Figures 3A, 3B, 3C, 3D, 3E:
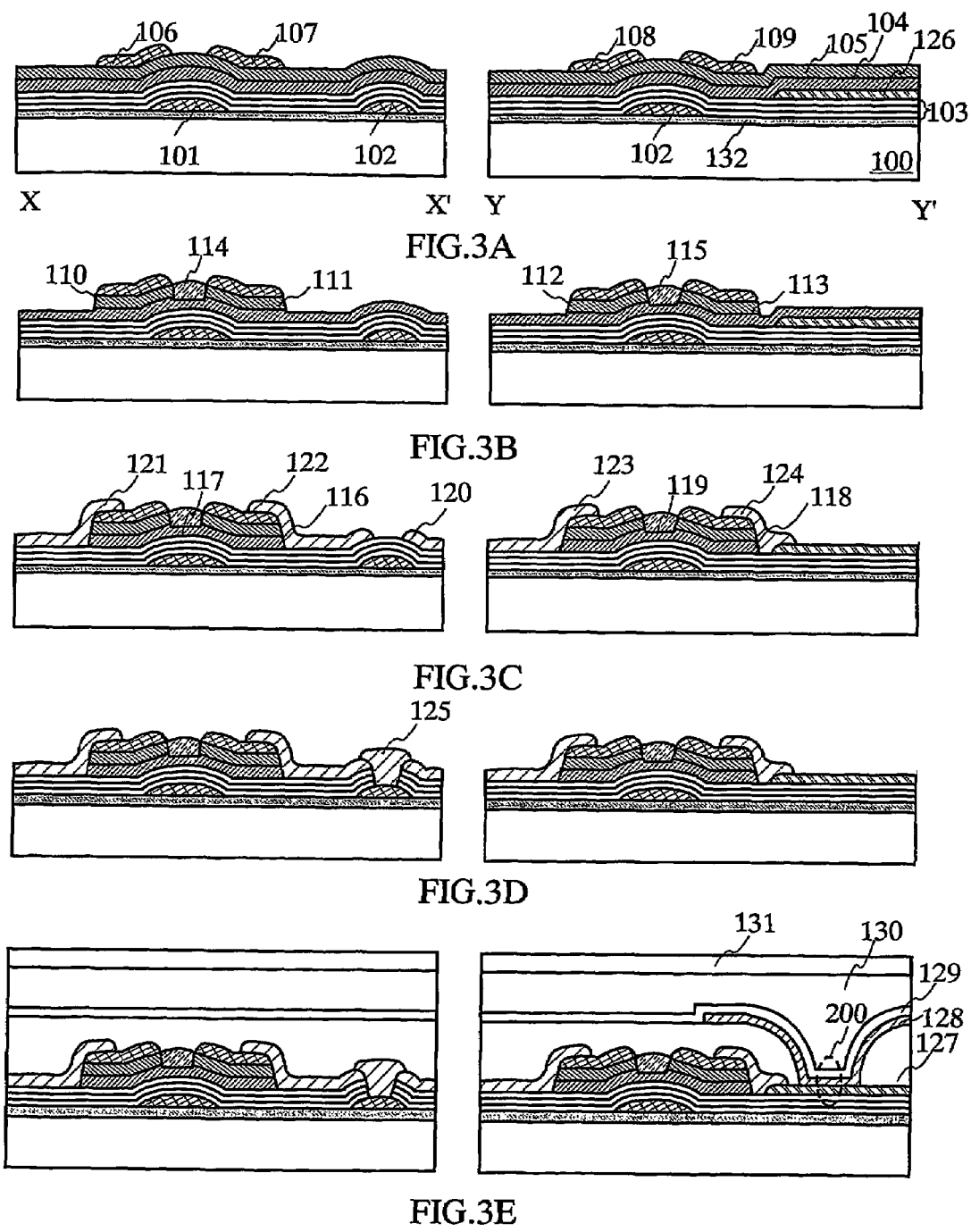
FIGS. 3A to 3E are schematic views for showing a manufacturing process of a light-emitting device according to the present invention.

As the first method, a titanium oxide film 132 can be directly formed over a substrate 100 as shown in FIG. 3. The titanium oxide film 132 may be formed all over the substrate by spin coating, droplet discharging, spraying, sputtering, CVD, or the like. Thereafter, gate electrode layers 101, 102 are formed over the titanium oxide film 132 by droplet discharging. Accordingly, the adhesiveness between the substrate 100 and the gate electrode layers can be improved by interposing the titanium oxide film 132 therebetween. After forming the gate electrode layers, the titanium oxide film 132 at the periphery of the gate electrode layers may be left or removed by etching. Further, the etching treatment is preferably carried out at atmospheric pressure. In addition, a titanium film may be formed instead of forming the titanium oxide film. Here, the gate electrode layers are formed by stacking Ag/Cu over the titanium oxide film. Alternatively, only Cu may be stacked over the titanium oxide film.

As the second method, a titanium oxide film can be selectively formed by droplet discharging. As the droplet discharging, screen printing or offset printing can be used in addition to ink jetting. Alternatively, sol-gel can be used. Thereafter, a gate electrode layer is selectively formed by droplet discharging over a region of forming a titanium oxide layer or an inner surface of the titanium oxide layer. In addition, a titanium film may be formed instead of forming the titanium oxide film.

Figure 16A:
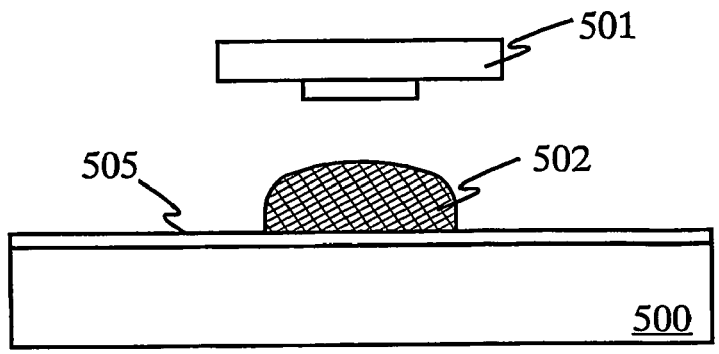
FIGS. 16A to 16C are explanatory views for showing a method for manufacturing a titanium oxide film.
Figure 16B:
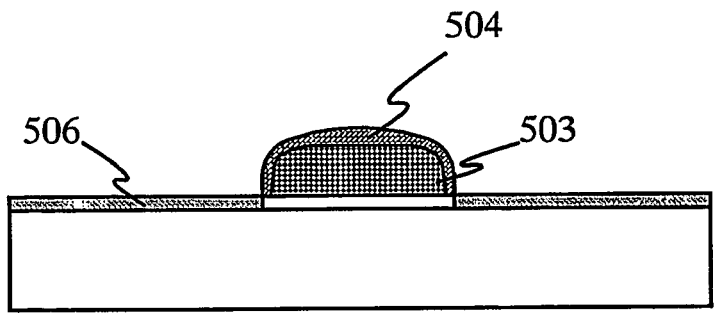
Figure 16C:
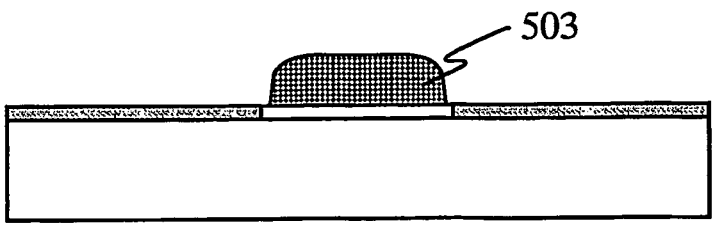
Figure 17A:
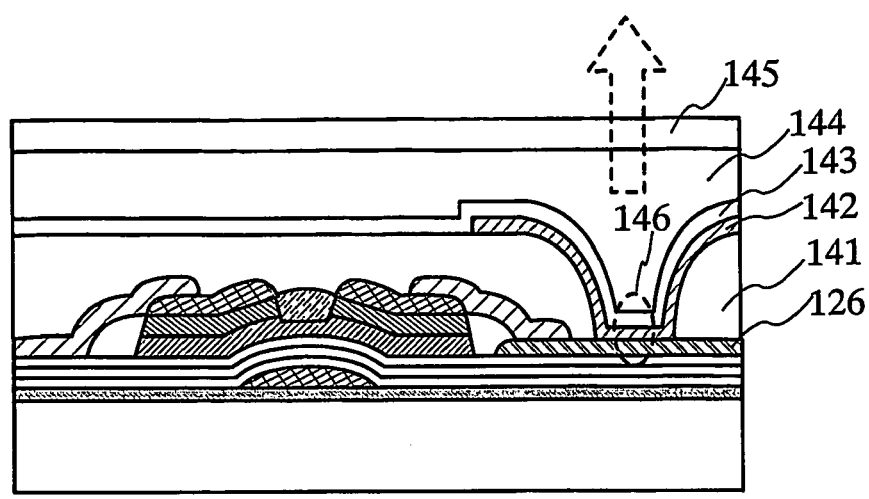
FIGS. 17A to 17C are explanatory views for showing a top emission light-emitting device, a bottom emission light-emitting device, and a dual emission light-emitting device.
Figure 17B:
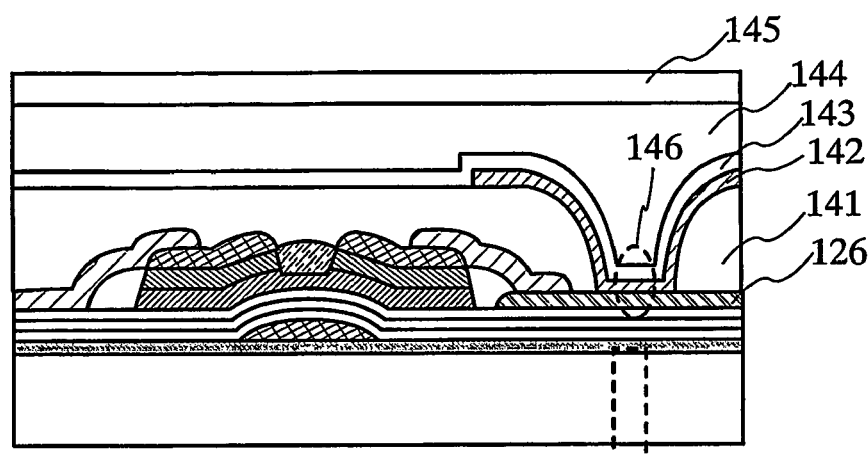

As the third method, a titanium film is formed all over a substrate by spin coating, droplet discharging, spraying, sputtering, CVD, or the like; and a composite containing a conductive material for forming a gate electrode layer is selectively formed over the titanium film by droplet discharging (FIG. 16A). Then, the composite is dried and baked. Simultaneously, the titanium film 505 is oxidized. Accordingly, a titanium oxide film 506 is formed at the periphery of the composite. The titanium oxide film is superior in light transmittance. For example, a titanium oxide film is effectively utilized in a bottom emission light-emitting device to emit light from a substrate as shown in FIG. 17B. After forming the titanium film all over a substrate by spin coating, droplet discharging, spraying, sputtering, CVD, or the like, the titanium oxide film may be formed by heat treatment before discharging selectively the composite containing a conductive material for forming a gate electrode layer.

In the foregoing first to third methods, instead of forming the titanium film and the titanium oxide film, so-called a photocatalyst substance can be used such as strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), ferric oxide ($Fe_2O_3$), tungsten oxide ($WO_3$), or the like. Alternatively, with respect to oxides, substance before being oxidized (Zr, Nb, Zn, Fe, W, or the like) can be used.

As the fourth method, the adhesiveness between a substrate and a gate electrode layer can be improved by forming polyimide, acrylic, heat resistant resin such as siloxane, or the like over the substrate. These materials may be formed all over the substrate or over a region where the gate electrode layer is formed. In the case of forming the materials all over the substrate, a film left at the periphery of the gate electrode layer may be removed by etching or ashing.

As the fifth method, the adhesiveness can be improved by plasma treatment of all over the substrate or the portion where the gate electrode layer is formed. The plasma treatment is, but not exclusively, carried out under atmospheric pressure preferably.

Embodiment 2

Figure 4A:
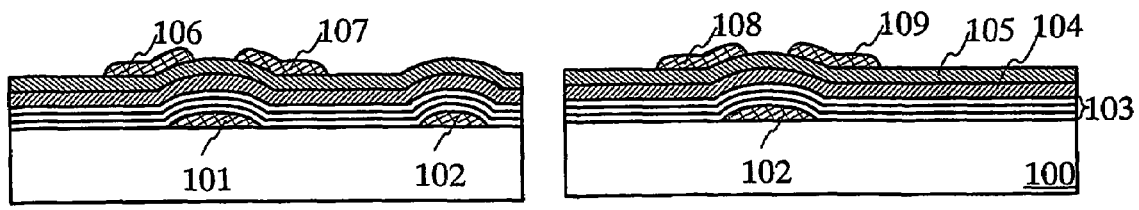
FIGS. 4A to 4E are schematic views for showing a manufacturing process of a light-emitting device according to the present invention.
Figure 4B:
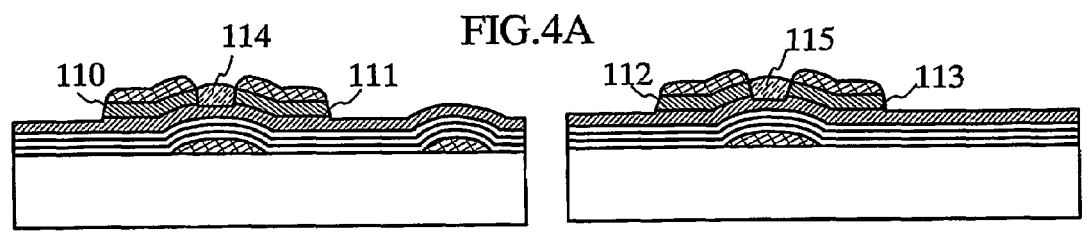

In Embodiment 2, a light-emitting device having a semiconductor element with another structure according to the present invention is explained with reference to FIGS. 4A to 4E (FIG. 4A to 4E show the right side diagram is a cross-sectional structure at the side of a drive TFT and the left side diagram is a cross-sectional structure at the side of a switching TFT.). The light-emitting device can be manufactured in a manner similar to that explained in the aforementioned Embodiment Mode up to the process of forming a source region and a drain region using a source electrode and a drain electrode as masks, and forming insulating films 114 and 115 above a portion serving as a channel region in a semiconductor film 104 by droplet discharging (FIG. 4B).

Then, island-like semiconductor films 116 and 118 are formed by etching the semiconductor film 104 using source electrodes or drain electrodes 106 to 109, and the insulating films 114 and 115 as masks. And then, island-like semiconductor films 401 and 402 are formed by etching a gate insulating film 103. Both etching are adopted by plasma etching with an etching gas of a chlorine gas such as $Cl_2$, $BCl_3$, $SiC_4$, or $CCl_4$; a fluoride gas such as $CF_4$, $SF_6$, $NF_3$, or $CHF_3$; or $O_2$ are used. However, it is not limited thereto. The etching can be carried out by using atmospheric plasma. In this instance, a mixed gas of $CF_4$ and $O_2$ is preferably used as an etching gas. Further, since the insulating films 114 and 115 serving as a channel protective film are formed above the channel regions 117 and 119 in the island-like semiconductor films 116 and 118, the channel regions 117 and 119 are not damaged due to overetching in the foregoing etching process. Hence, a channel protective type TFT (channel stopper type) having stable characteristics and high mobility can be manufactured without any resist mask. (FIG. 4C)

Figure 4C:
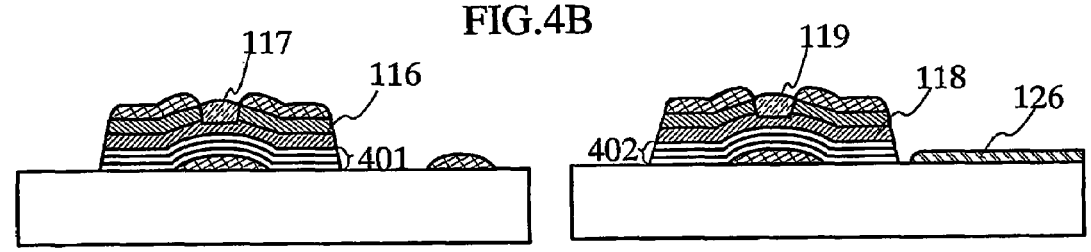
Figure 4D:
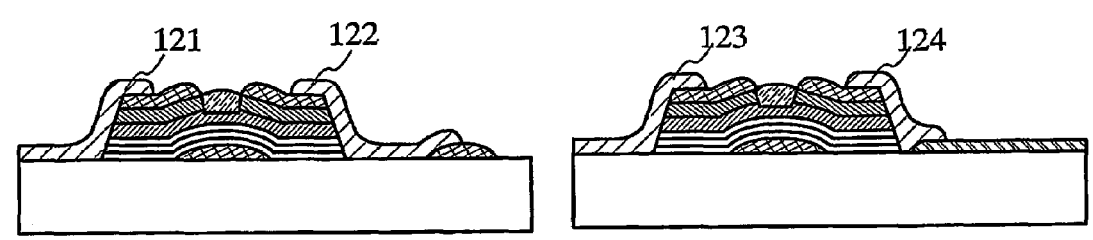
Figure 4E:
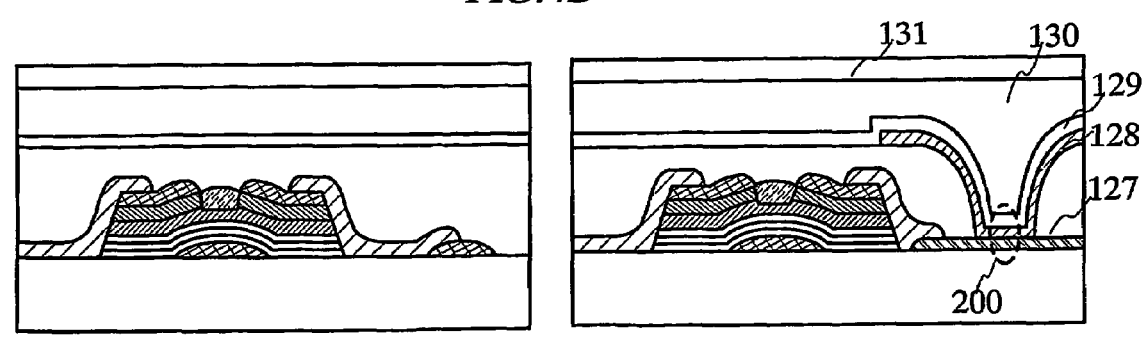

A composite containing a third conductive material is discharged so as to be in contact with the source electrodes or the drain electrodes 106 to 109 to form source wirings or drain wirings 121 to 124 (FIG. 4D). Since a gate insulating film is not provided to a contact portion of a gate-drain of a gate electrode layer of a drive TFT, the gate and the drain can be connected with each other by a wiring 122 without forming a contact hole, and so a process can be simplified. However, a cross section portion 1612 of a scanning line 1606, signal lines 1605 and 1607, a capacity portion 1611, and the like are required to be provided with a gate insulating film, accordingly, it is required to provide a mask thereto in etching the gate insulating film. The mask is preferably formed by droplet discharging of polyimide, acrylic, siloxane, or the like.

In case of forming a pixel electrode 126 after etching the gate insulating film 103 as shown in FIG. 4C, a composite is discharged to connect a source wiring or a drain wiring of the driver TFT to the pixel electrode 126. In case that a light-emitting element is formed by stacking layers sequentially (see FIG. 1), the pixel electrode 126 serves as a hole injecting electrode (anode) and the wiring 124 serves as a source wiring. On the other hand, in case that a light-emitting element is formed by stacking layers inversely (see FIG. 2), the pixel electrode 126 serves as an electron injecting electrode (cathode) and the wiring 124 serves as a drain wiring.

The third conductive material, a conductive particle structure, a discharge condition, a drying condition, a baking condition, or the like can be appropriately selected from those explained in the foregoing first conductive material. Further, the second and the third conductive materials and the second and the third particle structures may be the same or different. The pixel electrode is preferably formed by droplet discharging using a transparent conductive film such as ITO, ITSO, ZnO, GZO, IZO, organic indium, or organic tin.

Although not shown, pretreatment for improving the adhesiveness with a bottom layer may be carried out in forming the source wirings or the drain wirings 121 to 124, and the pixel electrode 126. The pretreatment may be carried out in a manner similar to that for forming the gate electrode layers 101 and 102.

A light-emitting device can be obtained by forming a light-emitting element 200 in a manner similar to that explained in the aforementioned Embodiment Mode or another Embodiments.

Embodiment 3

Figures 5A, 5B, 5C, 5D, 5E:
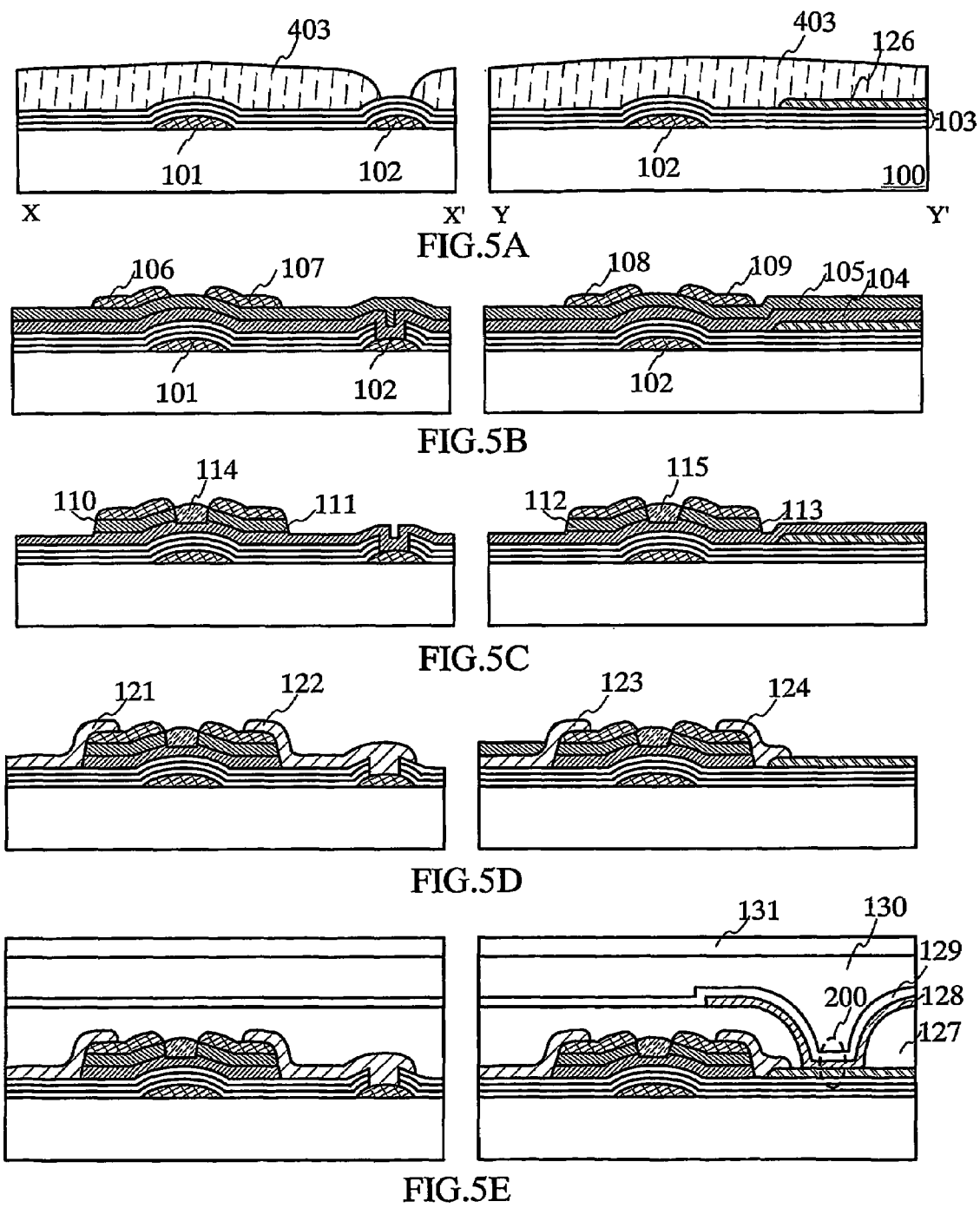
FIGS. 5A to 5E are schematic views for showing a manufacturing process of a light-emitting device according to the present invention.

FIG. 5 illustrates a method for forming a contact hole by etching a gate insulating film 103 with a mask that can be formed by droplet discharging, for forming a semiconductor layer 105 or the like, and for forming source wirings or drain wirings 121 to 124 in order to connect gate-drain. FIG. 5A to 5E show the right side diagram is a cross-sectional structure at the side of a drive TFT and the left side diagram is a cross-sectional structure at the side of a switching TFT. A mask 403 is formed by droplet discharging of, but not exclusively, polyimide, acrylic, siloxane, or the like. By forming a contact hole preliminarily with the mask 403, the gate-drain can be connected with each other at once in forming the wiring 122 (FIG. 5D). A contact hole may be formed by etching selectively by atmospheric plasma without using a mask.

A light-emitting device can be obtained in accordance with another detailed process in a manner similar to that explained in Embodiment Mode or another Embodiments (FIG. 5E).

Embodiment 4

FIG. 6 illustrates a method for forming a column-like conductor (also referred to as a pillar or plug, hereinafter "pillar 601") that can be formed by droplet discharging to connect a gate to a drain. FIG. 6A to 6E show the right side diagram is a cross-sectional structure at the side of a drive TFT and the left side diagram is a cross-sectional structure at the side of a switching TFT. A conductive material contained in the pillar 601 may be the same as or different from that of a gate electrode layer. In case of being different, for example, the gate electrode layer may be laminated by Ag, and the pillar may be laminated by Cu. In this instance, the foregoing pretreatment such as the formation of a titanium oxide film is preferably carried out to prevent the film peeling of the gate electrode layer.

In the subsequent process, a gate insulating film 103, a semiconductor film 104, and an n-type semiconductor film 105 are formed over the pillar 601. However, these films can be hardly deposited over the pillar 601 since the pillar 601 is formed of projection. If these layers can be deposited, these layers are formed having fairly thinner thicknesses than those formed another region. Therefore, the surface of the pillar is exposed by etching the n-type semiconductor film 105 or the semiconductor film 104. For example, an insulating film over the pillar 601 is removed simultaneously with removing resist, which is formed for the etching, over the pillar 601 by ashing or the like. In case that the gate insulating film is left, the film may be selectively etched by atmospheric plasma or the like. By forming the pillar 601 preliminarily, a gate-drain can be connected with each other at once in forming the wiring 122 (FIG. 6D). Further, a p-type semiconductor film can be used instead of the n-type semiconductor film 105.

The pillar 601 is preferably formed continuously or intermittently by using nozzle having different discharge opening diameters as will hereinafter be described. A light-emitting device can be obtained in accordance with another detailed process in a manner similar to that explained in Embodiment Mode or another Embodiments (FIG. 6E).

Embodiment 5

FIG. 7 illustrates a method for forming an insulating film 701 (also referred to as an edge cover) that can be formed by droplet discharging in forming source wirings or drain wirings 121 to 124 in the above mentioned Embodiment Mode or another Embodiments. FIG. 7A to 7E show the right side diagram is a cross-sectional structure at the side of a drive TFT and the left side diagram is a cross-sectional structure at the side of a switching TFT. By forming an edge cover, step coverage can be improved and film peeling can be prevented. As the insulating film 701, polyimide, acrylic, siloxane, or the like is preferably formed selectively by droplet discharging. Further, this Embodiment Mode is especially effective for etching the gate insulating film explained in Embodiment 2.

Figure 7A:
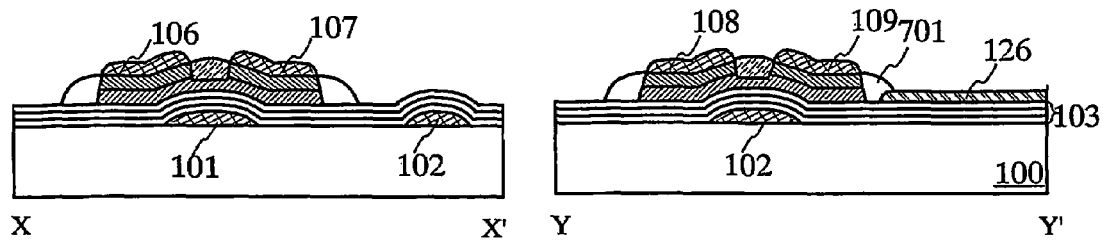
FIGS. 7A to 7E are schematic views for showing a manufacturing process of a light-emitting device according to the present invention.
Figure 7B:
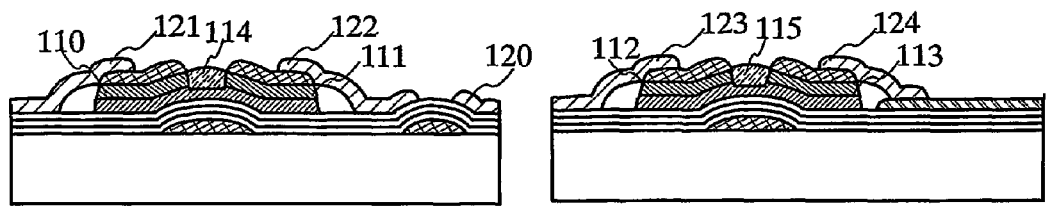
Figure 7C:
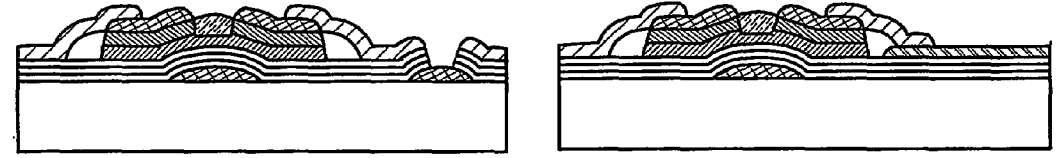
Figure 7D:
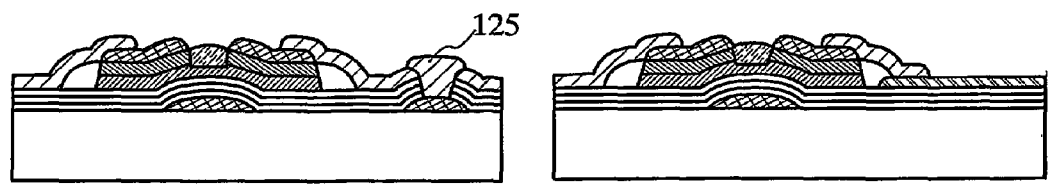
Figure 7E:
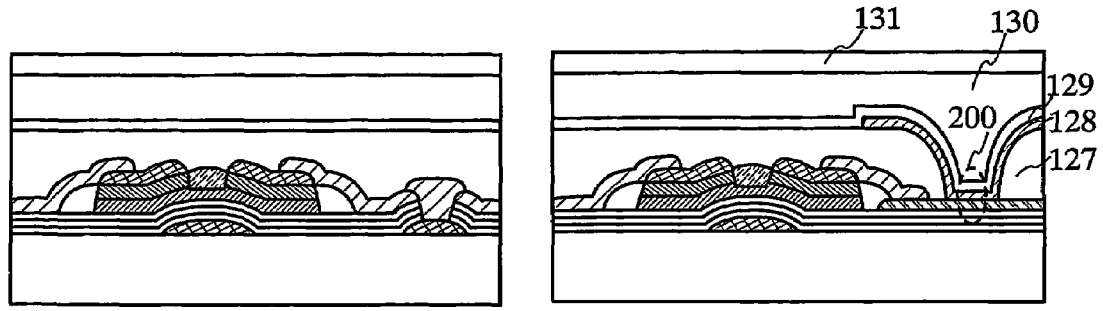
Figures 8A, 8B, 8C, 8D, 8E:
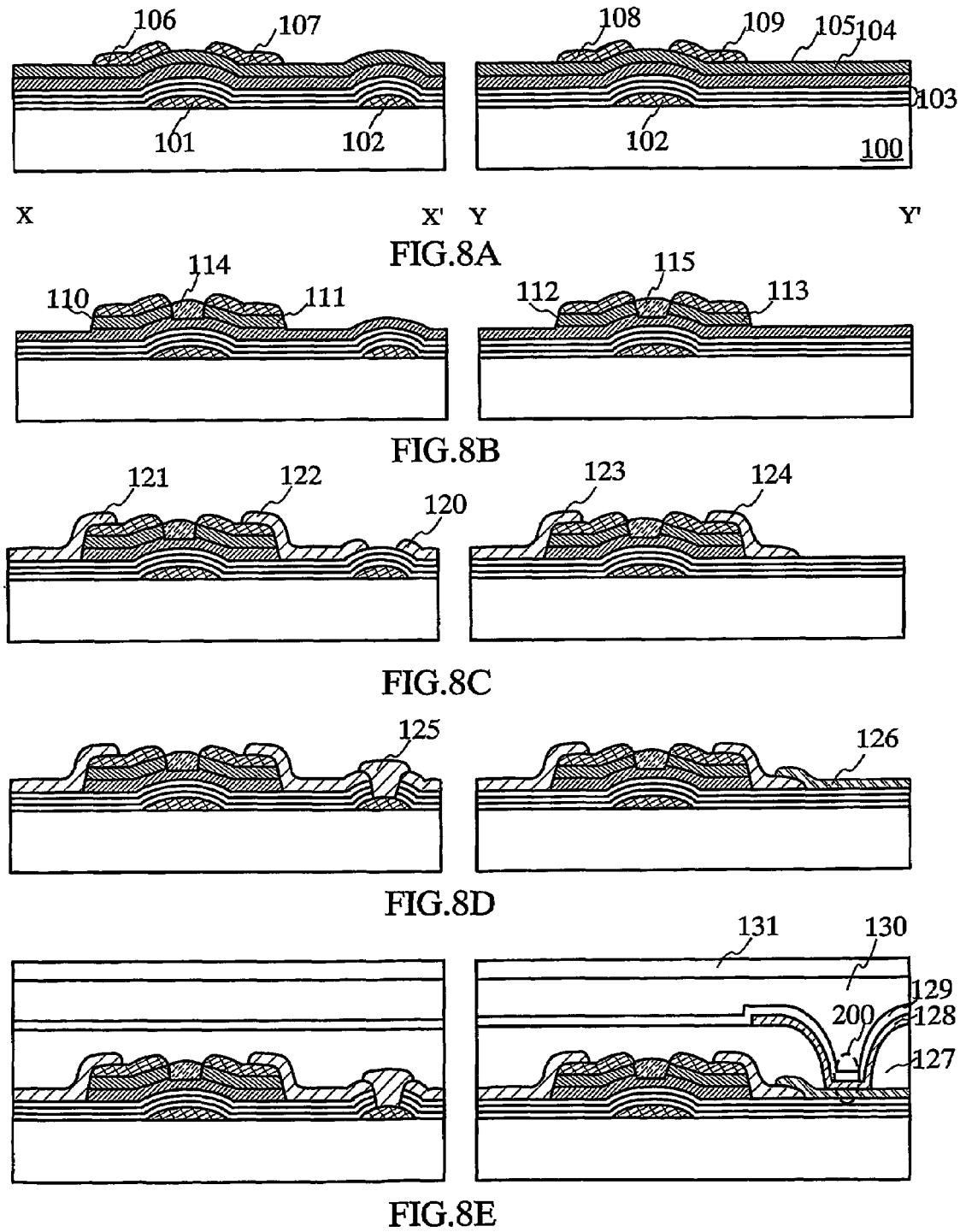
FIGS. 8A to 8E are schematic views for showing a manufacturing process of a light-emitting device having a planarized film according to the present invention.

A light-emitting device can be obtained in accordance with another detailed process in a manner similar to that explained in Embodiment Mode or another Embodiments (FIG. 7E). In the aforementioned Embodiment Mode or another Embodiments, the pixel electrode 126 may be formed after forming source wirings or drain wirings 121 to 124 as will described with reference to FIG. 8.

Embodiment 6

FIGS. 9 to 12 show a method for forming a pixel electrode and a light-emitting element over a planarized film provided over a TFT manufactured according to the present invention.

Figure 9A:
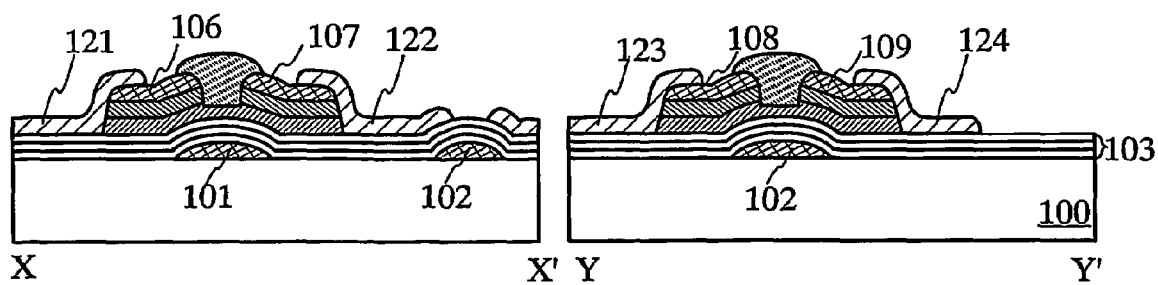
FIGS. 9A to 9C are a schematic view for showing a manufacturing process of a light-emitting device having a planarized film according to the present invention.
Figure 9B:
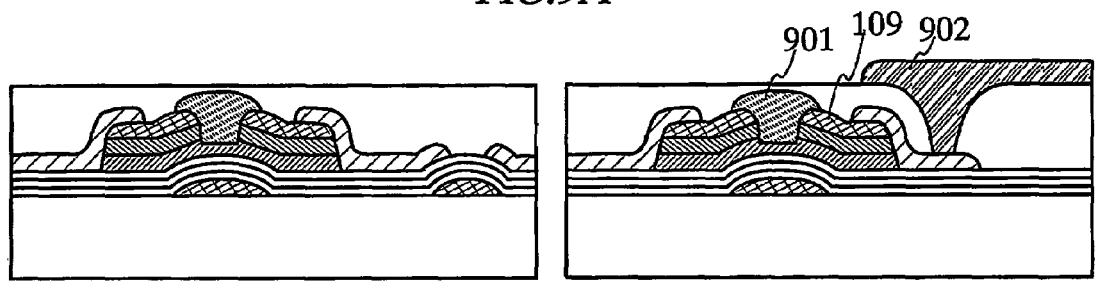
Figure 9C:
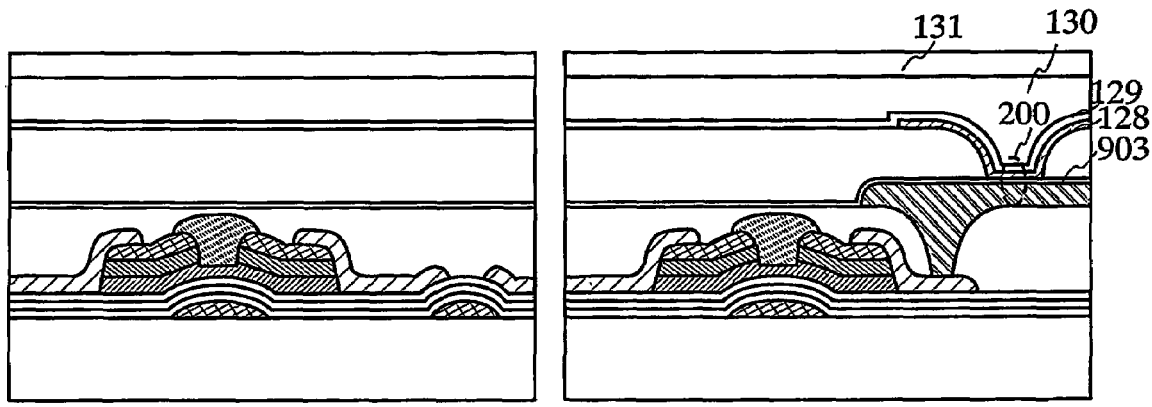

As the first method, as shown in FIGS. 9A to 9C (FIGS. 9A to 9C show the right side diagram is a cross-sectional structure at the side of a drive TFT and the left side diagram is a cross-sectional structure at the side of a switching TFT), over the TFT manufactured according to the present invention, a planarized film 901 is selectively formed by droplet discharging, and a wiring 902, which is connected to source wirings or drain wirings 121 to 124, is formed by droplet discharging over the region where the planarized film is not formed. Further, the wiring 902 in a pixel TFT can also serve as a pixel electrode as shown in FIGS. 9A to 9C. Of course, a pixel electrode can be separately formed to connect to the source wiring or the drain wiring. Further, the wiring 902 and the source or the drain electrode 109 can be directly connected without forming the source wiring or the drain wiring. The source electrode, the drain electrode, the source wiring, and the drain wiring may be formed by all the same conductive material, or different conductive material.

The method does not use the concept that a contact hole is formed in a planarized film. However, it seems that a contact hole is formed in appearance. Hence, the method is referred to as loose contact. As the planarized film, an insulating film having an organic resin such as acrylic, polyimide and polyamide, or a Si—O bond and a Si—CH$_x$ bond, which is formed by organic resin such as acrylic, polyimide, or polyamide, or a siloxane based material as a starting material, is preferably used.

In case that the pixel electrode is an ITO or an ITSO, light emission efficiency can be improved by forming a barrier film 903 by a silicon nitride film.

A light-emitting device can be obtained in accordance with another process in a manner similar to that explained in Embodiment Mode or another Embodiments (FIGS. 9A to 9C).

Figure 10A:
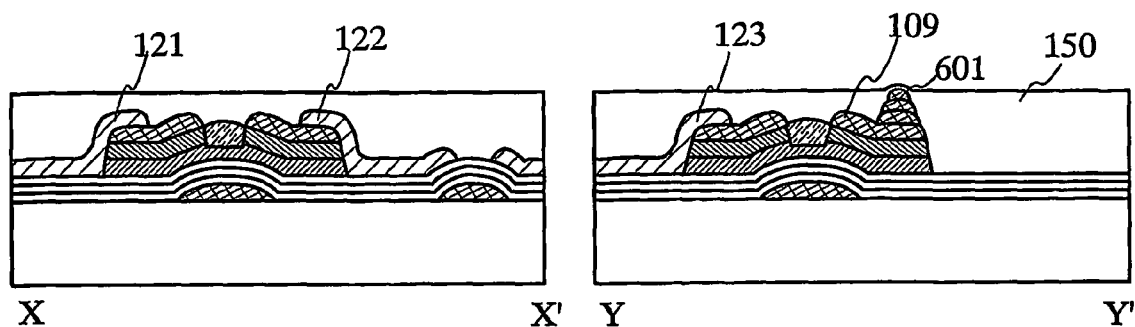
FIGS. 10A to 10C are a schematic view for showing a manufacturing process of a light-emitting device having a planarized film according to the present invention.
Figure 10B:
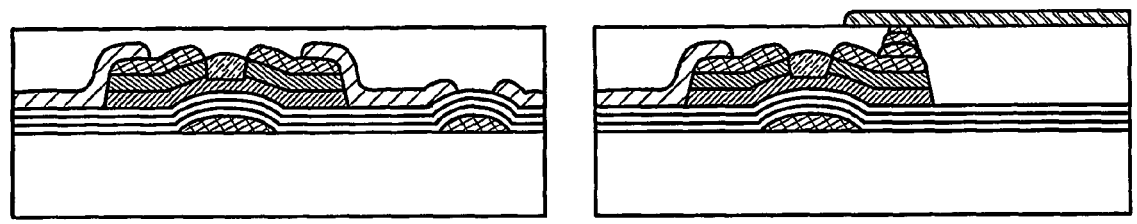
Figure 10C:
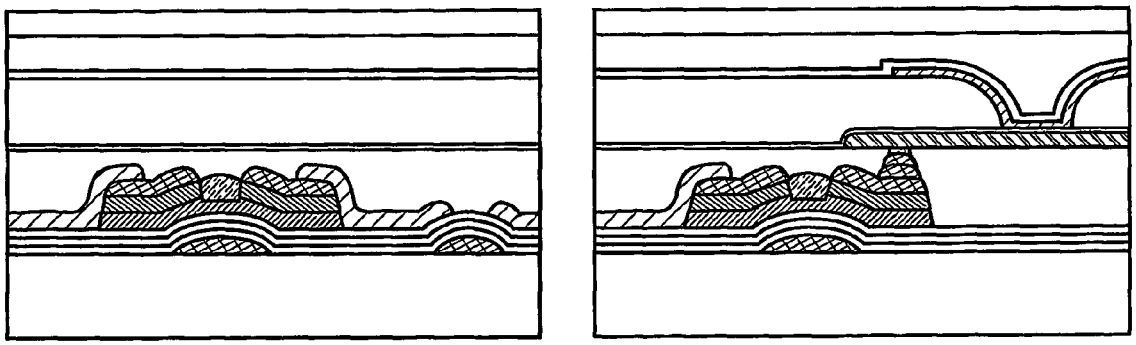

As the second method, as shown in FIGS. 10A to 10C (FIGS. 10A to 10C are referred to as pillar contact and show the right side diagram is a cross-sectional structure at the side of a drive TFT and the left side diagram is a cross-sectional structure at the side of a switching TFT.), a pillar 601 is formed by droplet discharging over a source electrode or a drain electrode 109 of a TFT manufactured according to the present invention. As a conductive material for forming the pillar 601, a similar material for forming the foregoing gate electrode layer or the like can be used. A planarized film 150 is formed over the pillar 601 by droplet discharging or the like. As the planarized film, an insulating film having an organic resin such as acrylic, polyimide and polyamide, or a Si—O bond and a Si—CH$_x$ band, which is formed by organic resin such as acrylic, polyimide, or polyamide, or a siloxane based material as a starting material by droplet discharging selectively, is preferably used.

In the case that a planarized film is formed over the pillar, the surface of the planarized film and the pillar is etched by etched back to obtain a pillar having a planarized surface as shown in a diagram at the center of FIGS. 10A to 10C. A source wiring and a drain wiring for connecting to a source electrode and a drain electrode are formed over the planarized film by droplet discharging. The source wiring and the drain wiring in the pixel TFT can serve as a pixel electrode as shown in a diagram at the bottom of FIGS. 10A to 10C. Needless to say, the pixel electrode can be formed separately to connect to the source wiring or the drain wiring. Further, the source electrode, the drain electrode, the pillar 601, the source wiring, and the drain wiring are formed by all the same conductive materials or different conductive materials. The subsequent process for forming a light-emitting element can be carried out in a manner similar to the first method.

Figure 11A:
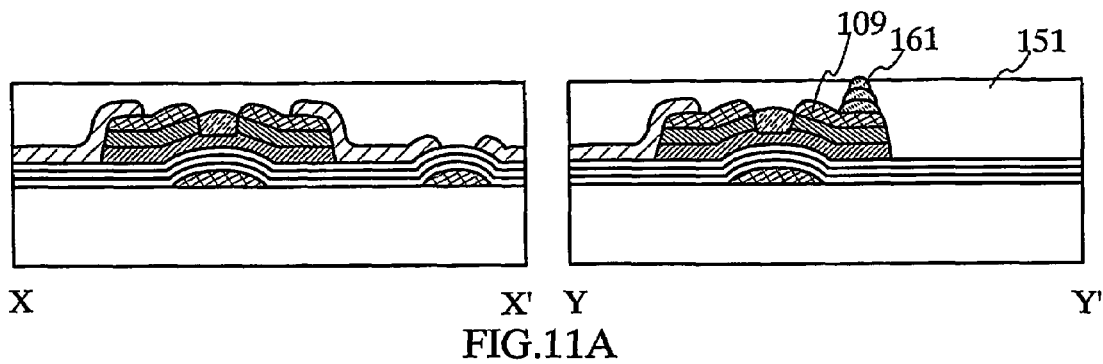
FIGS. 11A to 11D are a schematic view for showing a manufacturing process of a light-emitting device having a planarized film according to the present invention.
Figure 11B:
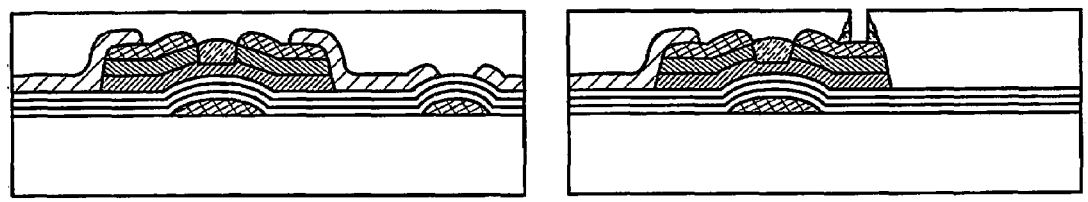
Figure 11C:
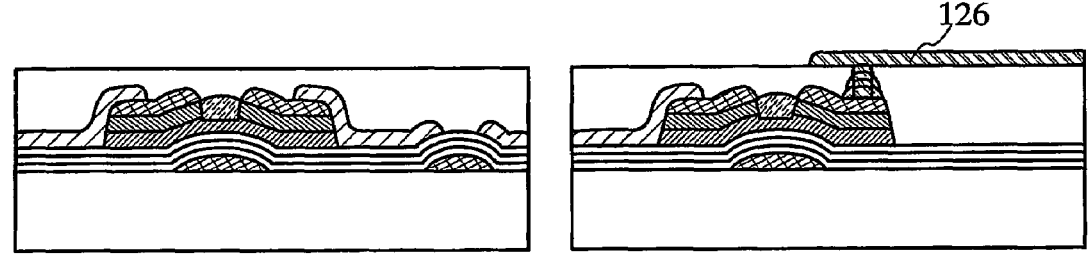
Figure 11D:
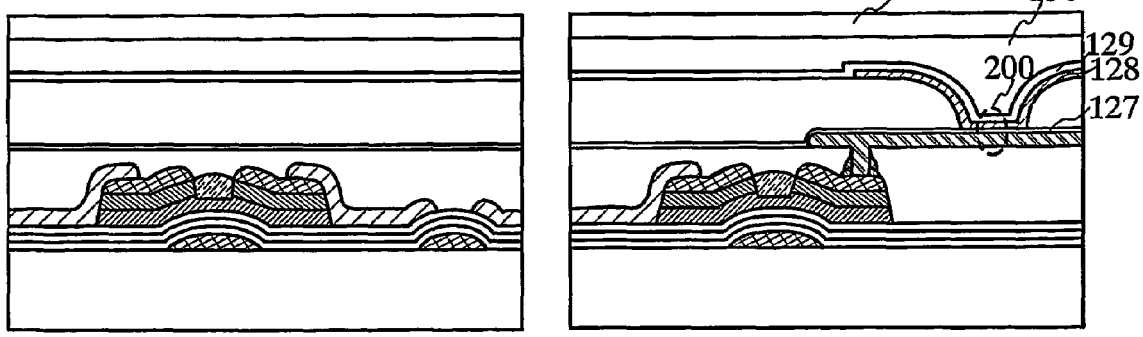

As the third method, as shown in FIGS. 11A to 11D (FIGS. 11A to 11C show forming a contact using a liquid-shedding organic film, and illustrate the right side diagram is a cross-sectional structure at the side of a drive TFT and the left side diagram is a cross-sectional structure at the side of a switching TFT.), a column-like insulator having liquid-shedding quality with respect to the material of a planarized film 151 (hereinafter, pillar insulator 161) is formed over the source electrode or the drain electrode of the TFT manufactured according to the present invention by droplet discharging; and the planarized film 151 is formed at the periphery of the pillar insulator 161. As a material for the pillar insulator 161, water-soluble organic resin such as PVA (polyvinyl alcohol) is treated in $CF_4$ plasma, or the like to have liquid-shedding quality can be used. As the planarized film, an insulating film having an organic resin such as acrylic, polyimide, and polyamide or an insulating film consisting of Si—O bond and a Si—$CH_x$ band formed by a siloxane based material as a starting material by droplet discharging selectively, is preferably used. After forming the planarized film 151 at the periphery of the pillar insulator 161, the pillar insulator 161 can be easily removed by water washing treatment, etching, or the like. In case of removing by etching, an anisotropic etching is preferably carried out to prevent a contact hole from being a reverse-taper form. Further, since the pillar insulator such as PVA, or the like has an insulating property, there will arise no problem even if a part of the pillar insulator is left at the sidewall of the contact hole.

Thereafter, a source wiring and a drain wiring connected to a source electrode and a drain electrode via a contact hole are formed by droplet discharging over the planarized film 151. The source wiring or the drain wiring in the pixel TFT can serve as a pixel electrode as shown in a diagram at the bottom of FIGS. 11A to 11D. Needless to say, the pixel electrode can be formed separately to connect to the source wiring or the drain wiring. Further, the source electrode, the drain electrode, the source wiring, and the drain wiring are formed by all the same conductive materials or different conductive materials. In case that a contact hole is formed to have a reverse-taper form due to a removing process of the foregoing pillar insulator, a composite containing a conductive material may be stacked by droplet discharging to fill the contact hole in forming the source wiring and the drain wiring. The subsequent process for forming a light-emitting element can be carried out in a manner similar to the first method.

As the fourth method, as shown in FIGS. 12A to 12E (FIGS. 12A to 12E show forming a contact using a liquid-shedding organic film, and illustrate the right side diagram is a cross-sectional structure at the side of a drive TFT and the left side diagram is a cross-sectional structure at the side of a switching TFT), a material having liquid-shedding quality 162 (hereinafter, liquid-shedding material 162) with respect to a material of a planarized film 151 is formed over a source electrode and a drain electrode of a TFT manufactured according to the present invention by droplet discharging, spin coating, spraying, or the like; a mask 163 is formed by PVA, polyimide, or the like is formed to the region where a contact hole is to be formed; the liquid-shedding material 162 is removed by using PVA or the like; and a planarized film 151 is formed at the periphery of the left liquid-shedding material. As a material for forming the liquid-shedding material 162, a fluorine silane coupling agent such as FAS (fluoroalkylsilane) or the like can be used. The mask 163 such as PVA, polyimide, or the like may be selectively formed by droplet discharging. The liquid-shedding material 162 can be removed by $O_2$ aching or atmospheric pressure plasma. Further, the mask 163 formed by PVA can be easily removed by water washing, or the mask 163 formed by polyimide can be easily removed by a stripper N300.

In the state that a part of the liquid-shedding material 162 is left at the region where a contact hole is to be formed (FIG. 12C), the planarized film 151 is formed by droplet discharging, spin coating, or the like. Since the liquid-shedding material 162 is partly left at the region where a contact hole is to be formed, the planarized film is not formed thereover. Further, the contact hole is not likely to be formed in a reverse-taper shape. As the planarized film, an insulating film having an organic resin such as acrylic, polyimide and polyamide, or a Si—O bond and a Si—$CH_x$ bond formed by a siloxane based material as a starting material by droplet discharging selectively is preferably used. After forming the planarized film 151, the liquid-shedding material 162 is removed by $O_2$ ashing or atmospheric pressure.

Figures 12A, 12B, 12C, 12D, 12E:
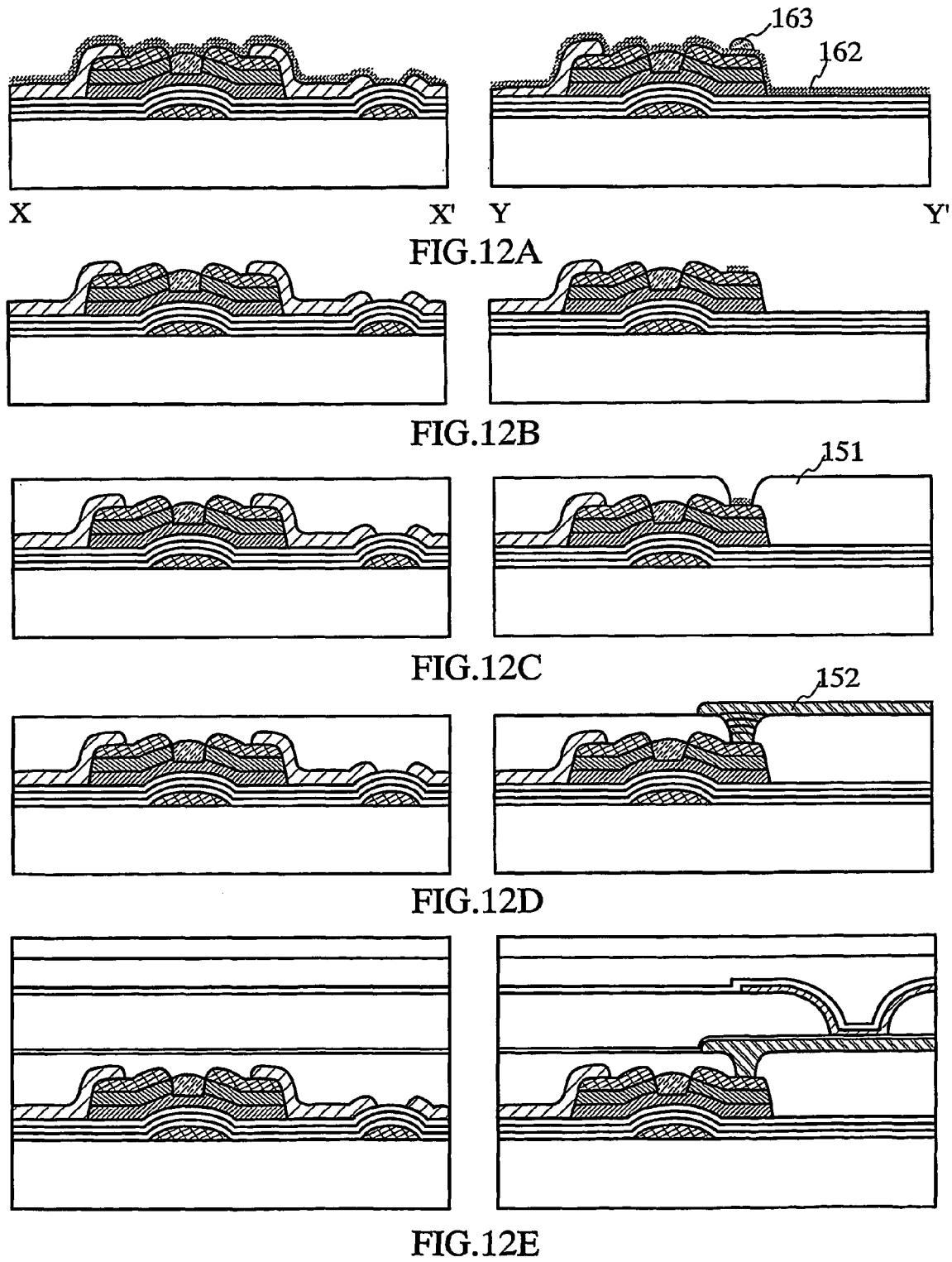
FIGS. 12A to 12E are a schematic view for showing a manufacturing process of a light-emitting device having a planarized film according to the present invention.

Thereafter, a source wiring or a drain wiring 152 connected to a source electrode or a drain electrode 109 via a contact hole is formed by droplet discharging over the planarized film 151. The source wiring or the drain wiring in the pixel TFT can serve as a pixel electrode as shown in FIG. 12E. Needless to say, the pixel electrode can be formed separately to connect to the source wiring or the drain wiring. Further, the source electrode, the drain electrode, and the source wiring, and drain wiring are formed by all the same conductive materials or different conductive materials. The subsequent process for forming a light-emitting element can be carried out in a manner similar to the first method.

In the foregoing first to fourth methods, not shown in FIGS. 9 to 12, the adhesiveness may be improved by interposing a TiOx film or the like by pretreatment between the substrate and the gate electrode layer. The pretreatment can be carried out in case of forming the source wiring, the drain wiring, the pillar, and the pixel electrode. As the pretreatment, the treatment explained in the aforementioned Embodiment Mode and Embodiments can be used.

In addition, a passivation film for preventing impurities from dispersing over the TFT is preferably formed over the source electrode and the drain electrode (not shown). The passivation film can be formed by a silicon nitride, a silicon oxide, a silicon nitride oxide, a silicon oxynitride, an aluminum oxynitride; or the other insulating materials such as an aluminum oxide, diamond like carbon (DLC), or carbon containing nitrogen (CN) by a thin film formation method such as plasma CVD, sputtering, or the like. The material may be the same as that used for forming the channel protecting film. Alternatively, these materials can be stacked. Further, the passivation film can be formed by a composite containing particles that are insulating materials by droplet discharging.

Embodiment 7

Figure 1A:
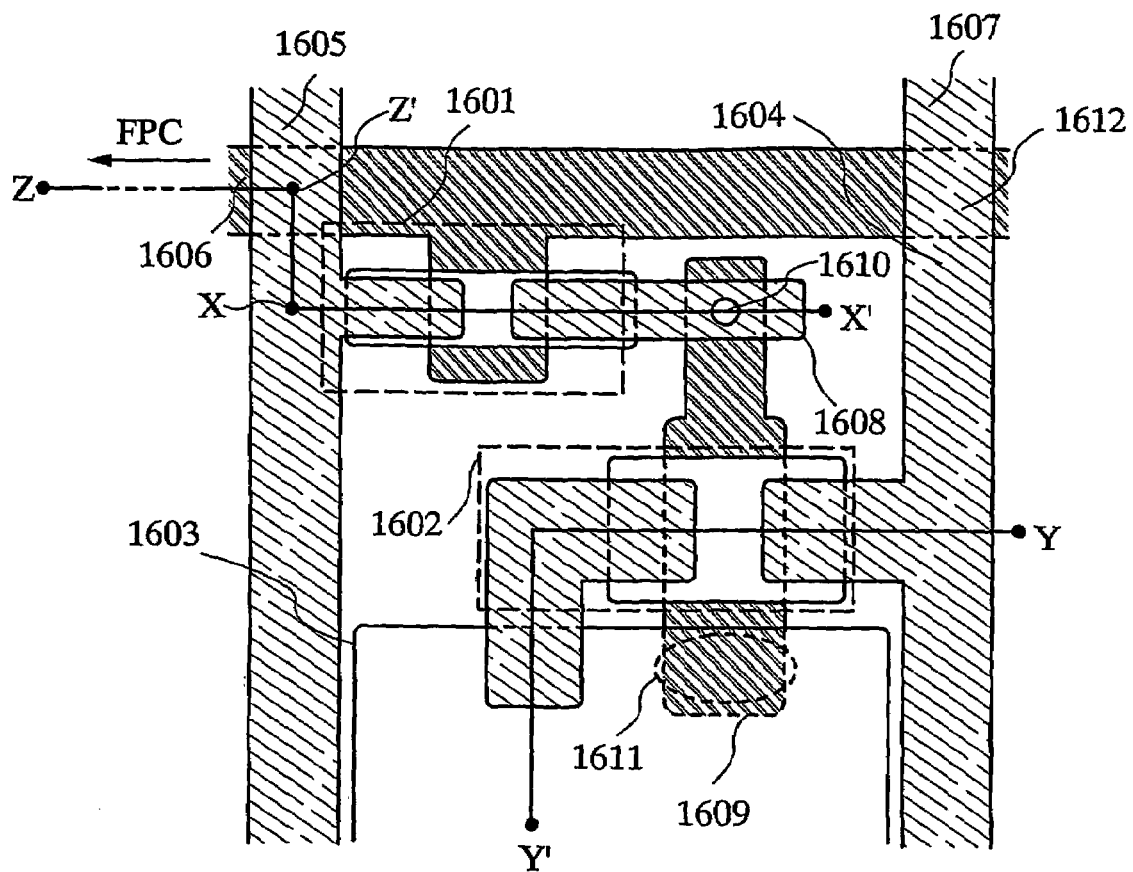
FIGS. 1A and 1B are a top view and a circuit diagram of a pixel portion of a light-emitting device according to the present invention, respectively.
Figure 1B:
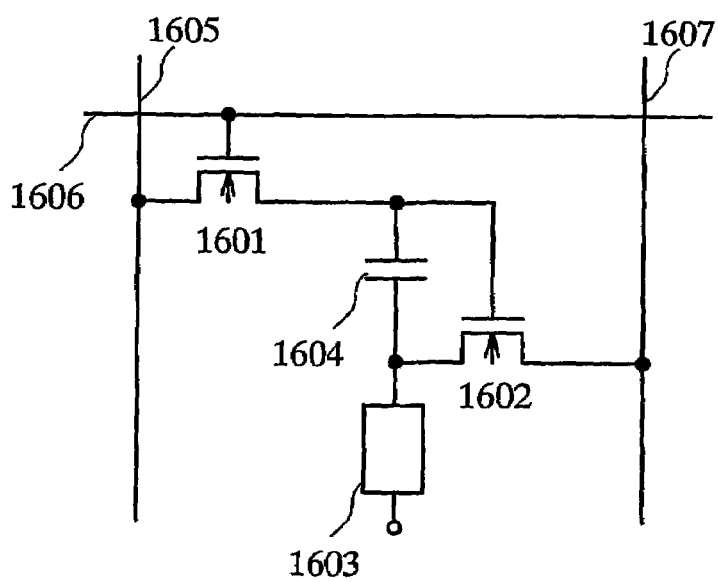
Figure 2A:
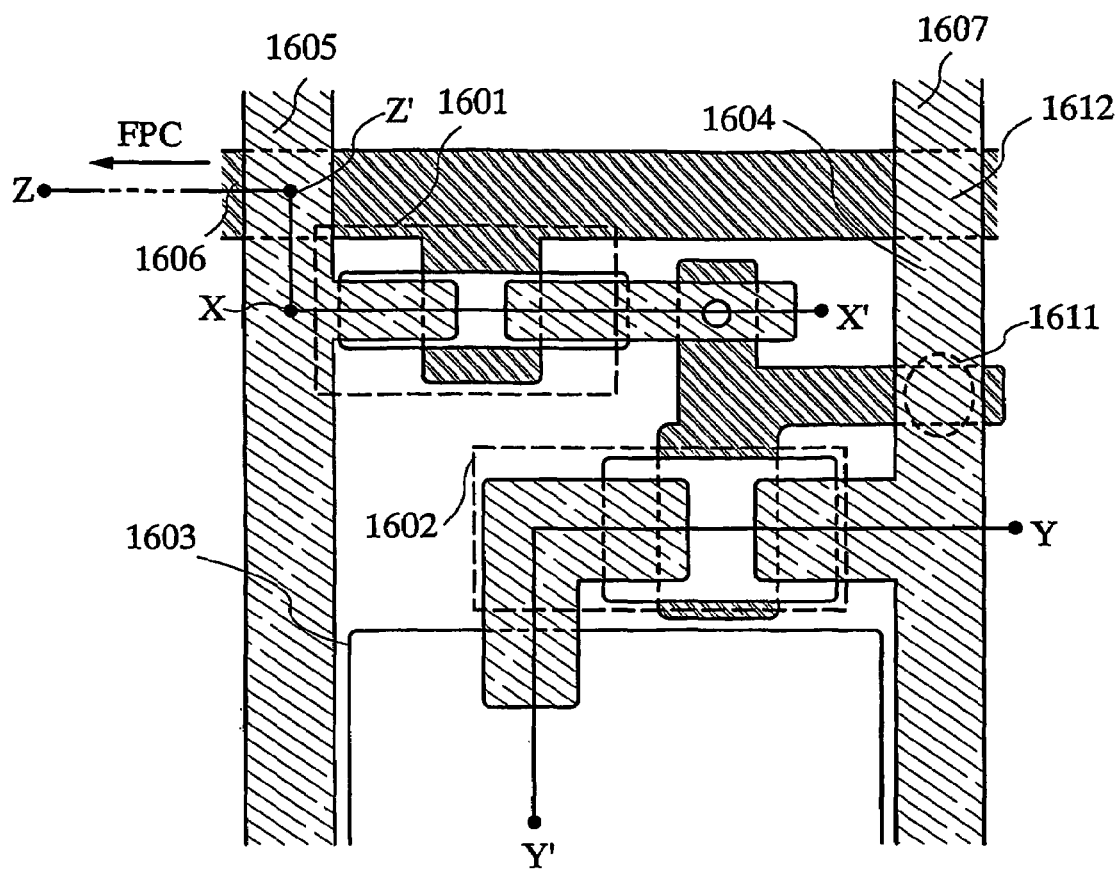
FIGS. 2A and 2B are a top view and a circuit diagram of a pixel portion of a light-emitting device according to the present invention, respectively.
Figure 2B:
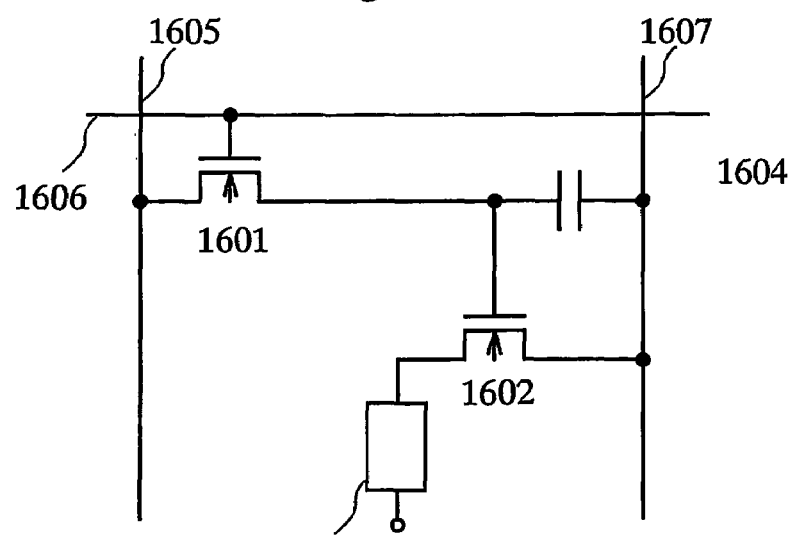
Figure 13A:
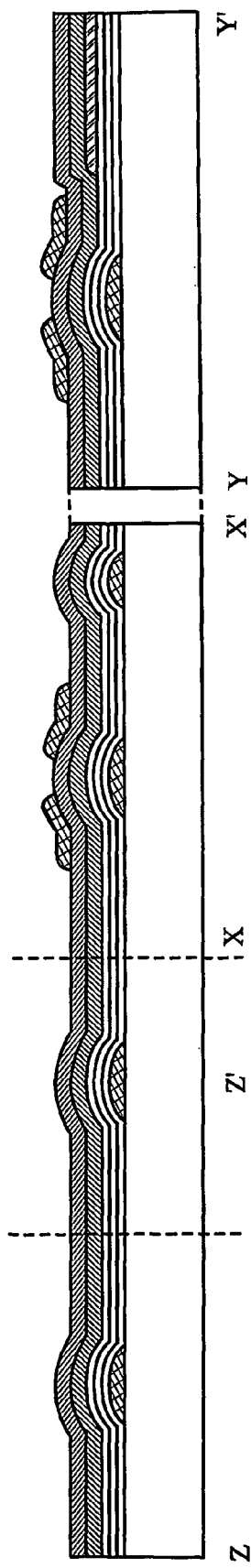
FIGS. 13A to 13C is a schematic view for showing a manufacturing process of a light-emitting device having a planarized film according to the present invention.
Figure 13B:
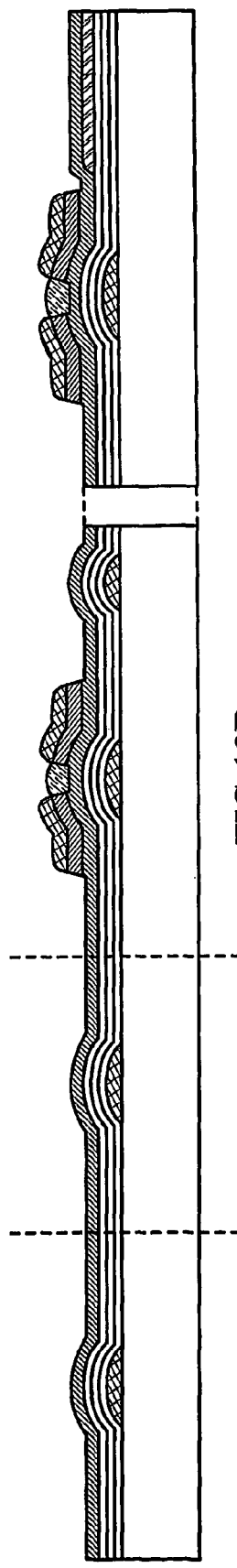
Figure 13C:
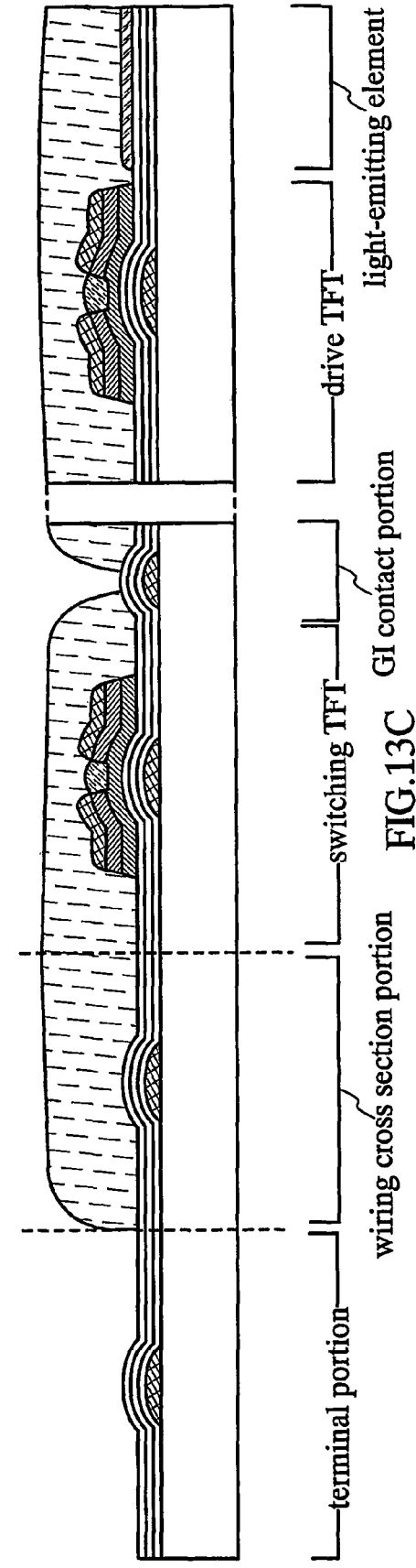
Figure 14A:
FIGS. 14A and 14B is a schematic view for showing a manufacturing process of a light-emitting device having a planarized film according to the present invention.
Figure 14B:
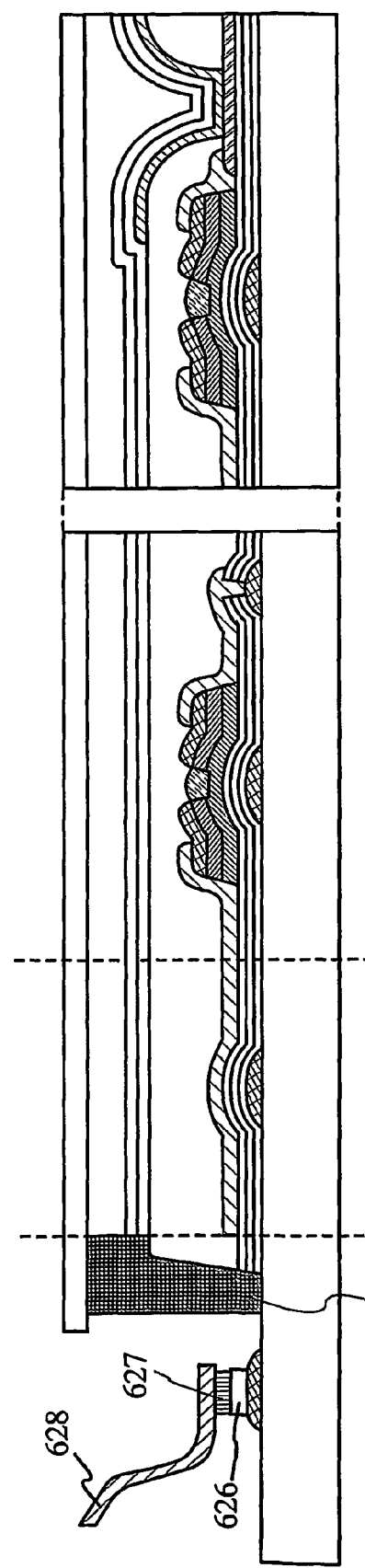

FIGS. 13 and 14 are cross-sectional views of FIGS. 1 and 2 taken along line of Z-Z'-X-X'-Y-Y'. In case that a terminal portion is required to be etched to leave a gate insulating film, the terminal portion may be removed in a manner similar to that shown in FIGS. 3 and 5. Further, a contact hole of a planarized film can be formed by the method explained in Embodiment 6.

With respect to the terminal portion, as shown in FIGS. 13A and 13B, a gate insulating film is left at the region except a TFT element portion. Therefore, a contact hole is required to be formed to connect a wiring that is formed simultaneously with forming a gate electrode layer to an FPC (Flexible Printed Circuit) 628. The contact hole may be formed by a known method. By pasting the FPC 628 and a terminal electrode 626 over a wiring with an anisotropic conductive film 627 by a known method, the wiring and the FPC 628 can be connected with each other. The terminal electrode 626 is preferably formed by a transparent conductive film. Further, reference numeral 625 denotes sealant for sealing a TFT substrate and an opposing substrate.

Embodiment 8

In a light-emitting device, a capacity portion is formed to hold a voltage between a gate and source of a drive TFT. FIGS. 1 and 2 are top views in which a planarized film is not formed. In case that a light-emitting element is formed by stacking layers sequentially (FIG. 1), a capacity portion 1611 is formed at a gate electrode layer, a gate insulating film, and a source wiring of a drive TFT; or at a pixel electrode having the same electric potential as those of a gate electrode layer, a gate insulating film, and a source wiring of a drive TFT. In case that a light-emitting element is formed by stacking layers inversely (FIG. 2), the capacity portion 1611 can be formed at a gate electrode layer, a gate insulating film, and a source wiring of a drive TFT.

Figure 15A:
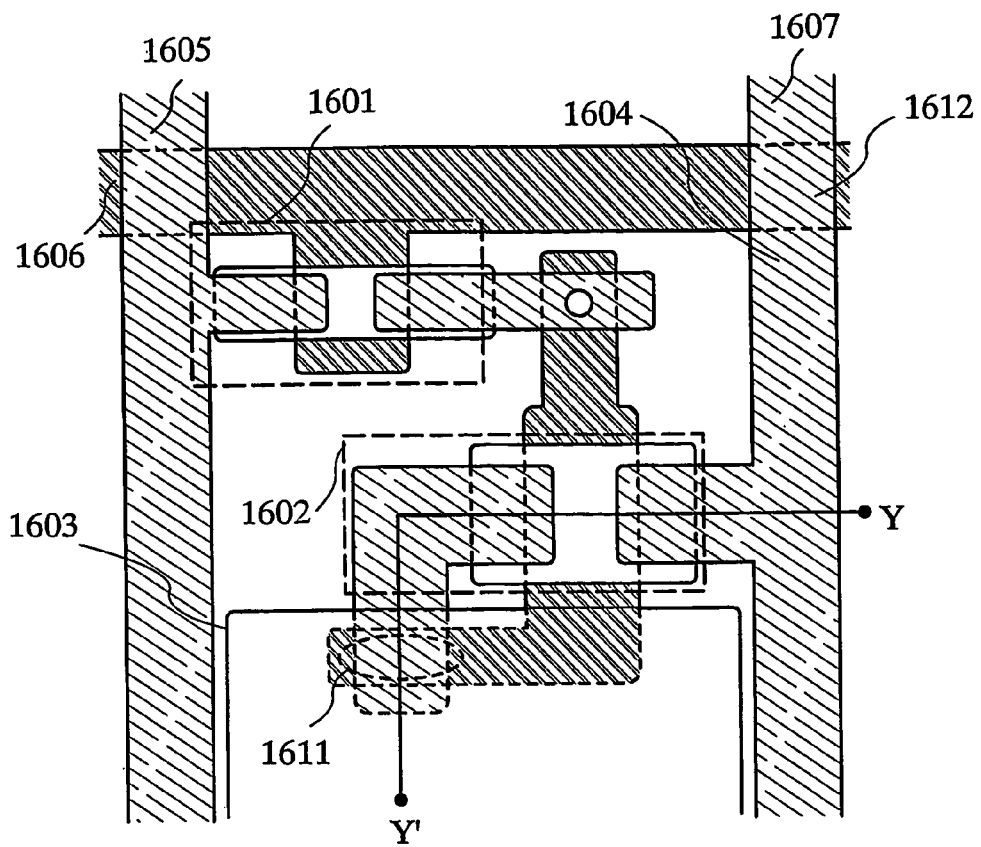
FIGS. 15A and 15B is a top view of a pixel portion of a light-emitting device according to the present invention.
Figure 15B:
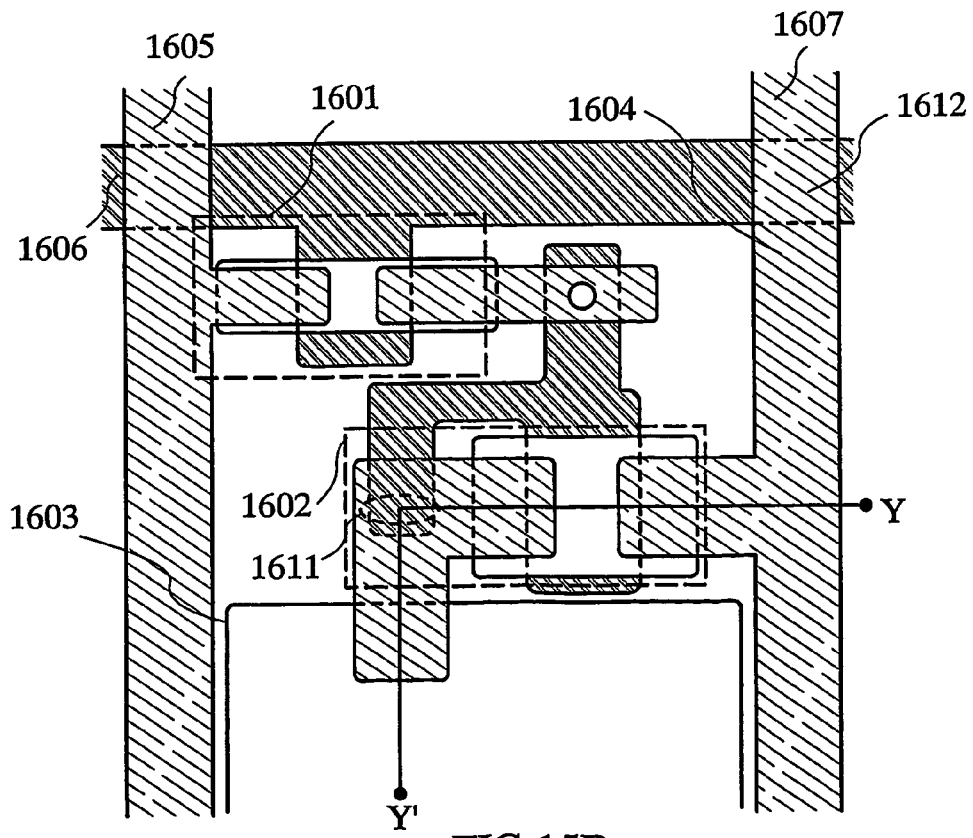

On the other hand, FIG. 15 shows a top view in which a planarized film is not formed. FIGS. 15A and 15B show the state in which a light-emitting element is formed by stacking layers sequentially. A capacity portion can be formed by a gate electrode layer, a gate insulating film, and a source wiring of a drive TFT at the place of the capacity portion 1611 in FIGS. 15A and 15B.

Embodiment 9

In Embodiment 9, the case that an insulating film serving as a channel protecting film is formed by stacking two layers is explained.

Figure 18A:
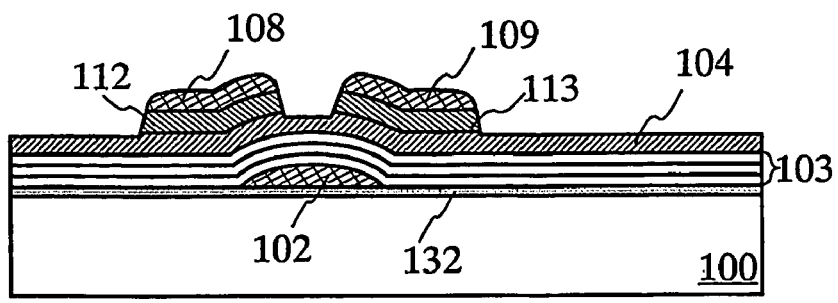
FIGS. 18A to 18D are schematic view for showing a manufacturing process of a semiconductor device according to the present invention.
Figure 18B:
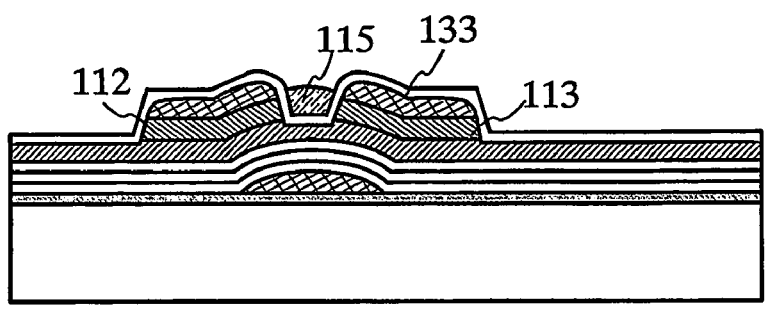

As in the state shown FIG. 1B, a source region 112 and a drain region 113 are formed by etching an n-type semiconductor film 105 using a source electrode 108 and a drain electrode 109 as masks (FIG. 18A shows only a cross-sectional surface of a drive TFT). Then, a silicon nitride film 133 is formed all over the surface by CVD, sputtering, or the like. An insulating film 115 is formed by droplet discharging above the region that serves as a channel region of a semiconductor film 104 and over the silicon nitride film 133. Since the insulating film 115 does not only serve as a channel protecting film but also a mask for removing the silicon nitride film 133, the insulating film 115 is formed by discharging a composite of heat resistant resin such as siloxane, or a substance having etching resistivity and insulating property such as acrylic, benzocyclobutene, polyamide, polyimide, benzimidazole, or polyvinyl alcohol, or the like. Siloxane and polyimide are preferably used. To prevent the channel region from being overetched, the silicon nitride film 133 and the insulating film 115 are preferably formed to have a total thickness of 100 nm or more, more preferably, 200 nm or more. (FIG. 18B)

The silicon nitride film 133 is etched off by using the insulating film 115 as a mask to form the insulating films 115, 134, each of which serves as a channel protecting film. The silicon nitride film is etched by plasma etching with an etching gas of a chloride gas as typified by $Cl_2$, $BCl_3$, $SiCl_4$, $CCl_4$, or the like, a fluoride gas as typified by $CF_4$, $SF_6$, $NF_3$, $CHF_3$, or the like, or $O_2$. However, the etching gas is not limited thereto. The etching treatment can utilize atmospheric pressure plasma.

The two-layered channel protecting film can improve a function as a channel protecting film, certainly prevent the channel region from being damaged, and provide a stable semiconductor element with high mobility. Alternatively, the channel protecting film may be formed by stacking three or more layers. The bottom layer thereof is not limited to a silicon nitride film; an insulating film containing another silicon may be used. Such channel protecting film may be formed by selectively stacking a film capable of being formed into a film by droplet discharging as the insulating film 115.

Figure 18C:
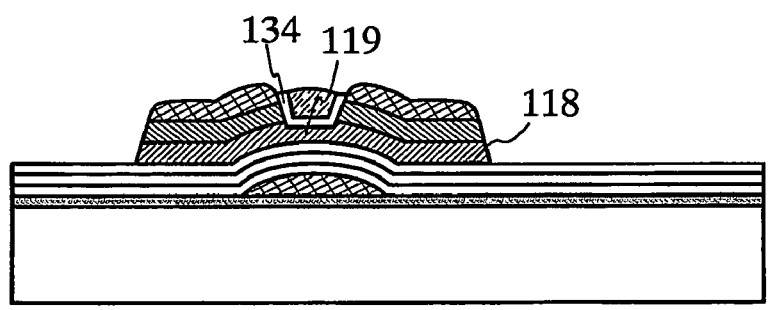

A semiconductor film 104 is etched by using the source electrode 108, a drain electrode 109, and the insulating films 115 and 134 as masks to form an island-like semiconductor film 118. The insulating film 115 and 134 is formed over a channel region 119 in the island-like semiconductor film 118. Accordingly, damages due to overetching in the foregoing etching process can be prevented. Therefore, a channel protecting (channel stopper) TFT having stable characteristics and high mobility can be manufactured without any resist mask. (FIG. 18C)

Figure 18D:
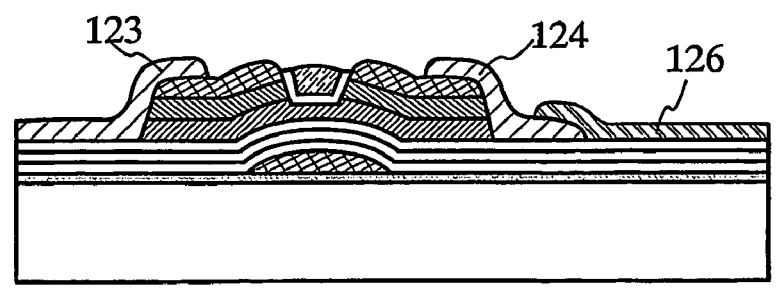

A source wiring 123 and a drain wiring 124 are formed by discharging a composite containing the third conductive material to be in contact with the source electrode 108 and the drain electrode 109 in a manner explained in Embodiment Mode. Further, the source wiring 123 or the drain wiring 124 is connected to a pixel electrode 126. Then, a light-emitting element is formed by a layer containing an organic compound or an inorganic compound (typically, a light-emitting element utilizing electroluminescence). Hence, a thin display such as an active matrix electroluminescent display device that can be controlled by a semiconductor element manufactured by the foregoing process can be obtained. (FIG. 18D)

Embodiment 10

In Embodiment 10, a method for forming a conductive film by combining droplet discharging with plating is explained.

Firstly, a composite containing Ag are formed by droplet discharging. In this instance, in case that a thick wiring is formed in a comparative narrow line width of several to ten several μm, the Ag is required to be discharged over and over. Alternatively, the line width can be increased by soaking a substrate provided with Ag in a plating solution containing Cu, or directly discharging the plating solution over the substrate. Especially, a composite formed by droplet discharging has a lot of unevenness. Accordingly, the plating can be easily carried out. In addition, Cu plating results the reduction of costs from the expensiveness of Ag. A conductive material for forming a wiring by a method according to this Embodiment Mode is not limited to the foregoing kinds.

After the Cu plating, the surface of the conductive film having a lt of unevenness is planarized by forming a buffer layer such as NiB or the like. Then, a gate insulating film is preferably formed.

Embodiment 11

Figure 17C:
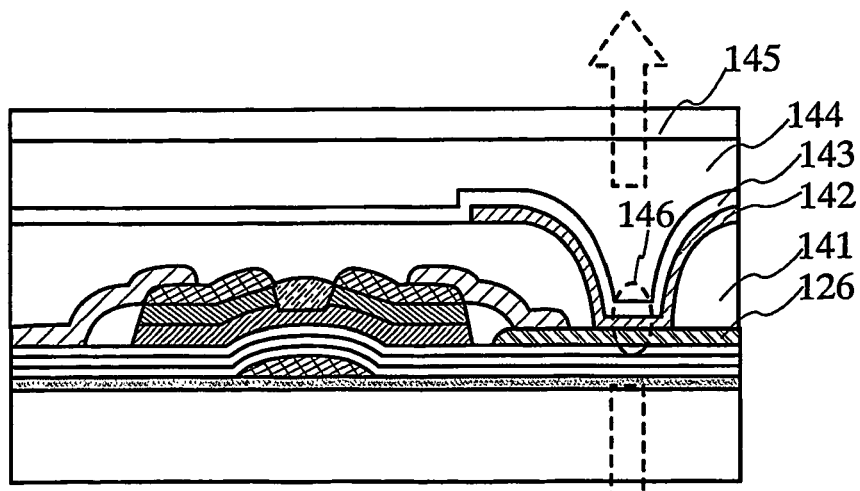

In the foregoing Embodiments, a bottom emission light-emitting device shown in FIG. 17B that is manufactured according to the present invention is explained. In Embodiment 11, a top emission light-emitting device shown in FIG. 17A and a dual emission light-emitting device shown in FIG. 17C, each of which is manufactured according to the present invention, are explained.

A dual emission light-emitting device is firstly explained. As a material for a hole injecting electrode, a transparent conductive film such as ITO, ITSO, ZnO, IZO, GZO, or the like can be used as in the case with the foregoing Embodiments. In case of using the ITSO as the pixel electrode 126, a plurality of layers of ITSO containing silicon oxides with different concentrations can be stacked. Preferably, a bottom ITSO layer (at the side of a source wiring or a drain wiring) has preferably a low concentration silicon oxide, and a top ITSO layer (at the side of a light-emitting layer) has preferably a high concentration silicon oxide. Accordingly, the connection between the pixel electrode 126 and a TFT can be kept in low resistance, and the hole injection efficiency to an electroluminescent layer can be improved. Of course, the pixel electrode can be formed by stacking the other material and the ITSO (for example, an ITO layer and an ITSO layer are sequentially stacked). Alternatively, a lamination layer composed of the further other materials may be formed.

As an electron injecting electrode 143 (cathode), a thin aluminum film with a thickness of 1 to 10 nm, an aluminum film containing traces of Li or the like is used to pass light generated in a light-emitting layer therethrough. Therefore, a dual emission light-emitting device that can emit light generated in a light-emitting element from both of top and bottom surfaces can be obtained. (FIG. 7C)

In FIG. 7, reference numeral 141 denotes a partition wall; 142, an organic compound layer; 144, a passivation film; 145, an opposing substrate; and 146, a light-emitting element.

Next, a top emission light-emitting device is explained with reference to FIG. 7A. In general, a top emission light-emitting device can be obtained in which light can be emitted from the side that is opposite to a substrate (top direction) according to the procedure: the pixel electrode 126 serving as an anode and an electron injecting electrode 143 are counterchanged in a bottom emission light-emitting device, and layers containing organic compounds are inversely stacked to reverse the polarity of a TFT for controlling current (n-type TFT is used). In case that an electrode and layers containing organic compounds are inversely stacked as shown in FIG. 7A, a high stable light-emitting device can be obtained with improved emission efficiency and with low power consumption by forming the pixel electrode 126 to have a lamination structure composed of light-transmitting oxide conductive layers provided different concentrations of silicon oxides. As the electron injecting electrode 143, a metallic electrode having light-reflectivity or the like can be used.

Embodiment 12

As an example of an electric appliance using an electroluminescent panel manufactured according to the foregoing Embodiment Mode or Embodiments, a TV reception set, a portable book (electronic book), and a cellular phone shown in FIG. 19 can be completed.

Figure 19A:
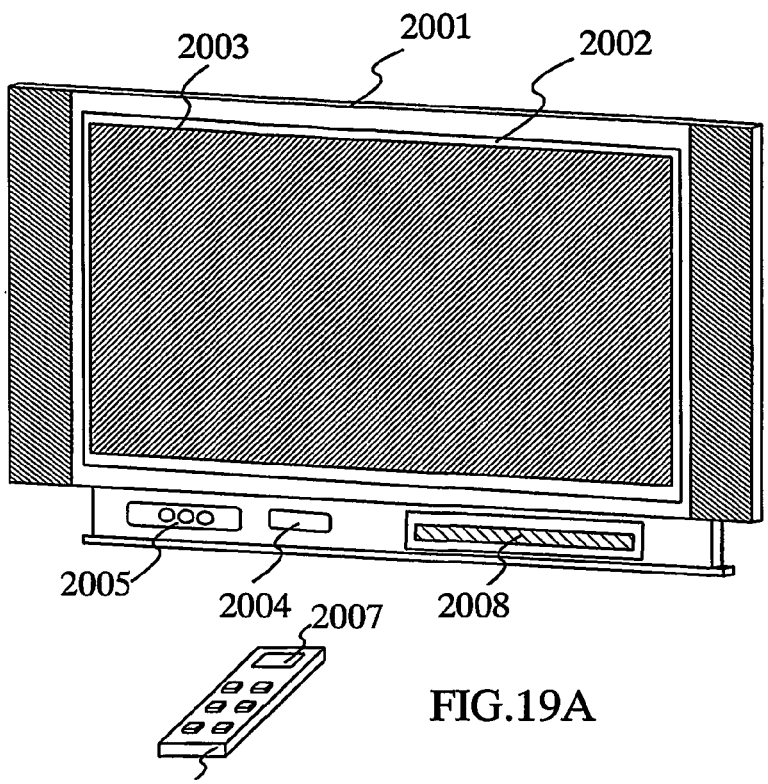
FIGS. 19A to 19C are explanatory views for showing examples of an electric appliance according to the present invention.

FIG. 19A shows a TV reception set in which a display module 2002 utilizing liquid crystals or electroluminescent elements is built in a housing 2001; and a receiver 2005 receives general TV broadcasting, and exchanges information one-directionally (a sender to receiver) and bi-directionally (between a sender and a receiver, or between receivers) by connecting to a wireless or a wired communication network via a modem 2004. The TV reception set can be operated by switches built in the housing or a wireless remote control 2006. The remote control 2006 can be provided with a display portion 2007 to display information.

A sub-screen 2008 manufactured by a second display module supplemented with displaying channels or volumes thereon can be provided to the TV reception set in addition to a main-screen 2003. The main-screen 2003 may be manufactured by an electroluminescent display module having a good viewing angle. The sub-screen may be manufactured by a liquid crystal display module that can display images at low power consumption. To place priority on reducing the power consumption, the main-screen 2003 may be manufactured by a liquid crystal display module, and the sub-screen may be manufactured by an electroluminescent display module that enables the sub-screen to flash.

Figure 19B:
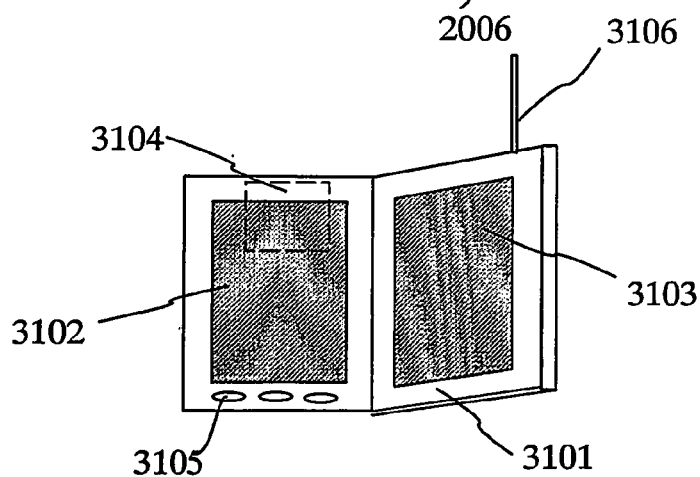

FIG. 19B shows a portable book (electronic book) composed of a main body 3101, display portions 3102 and 3103, a memory medium 3104, operation switches 3105, an antenna 3106, and the like.

Figure 19C:
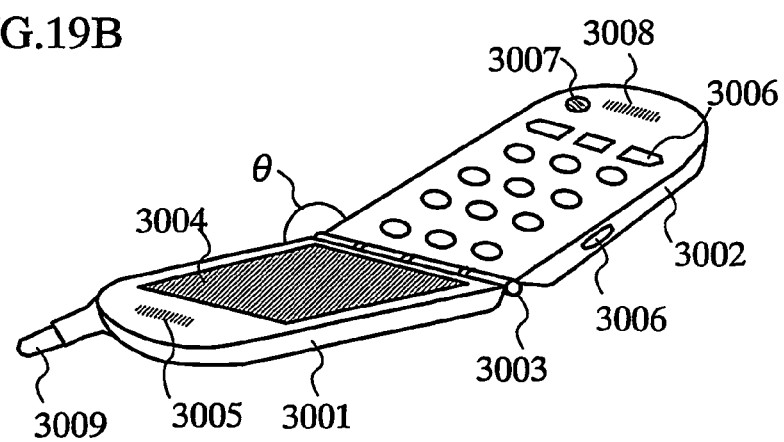

FIG. 19C shows a cellular phone. Reference numeral 3001 denotes a display panel, and 3002 denotes an operation panel. The display panel 3001 and the operation panel 3002 are connected with each other via a connecting portion 3003. The angle θ can be arbitrarily changed at the connecting portion 3003 between a face provided with a display portion 3004 on the display panel 3001 and a face provided with operation keys 3006 on the operation panel 3002. The cellular phone also comprises a voice output portion 3005, operation keys 3006, a power source switch 3007, a voice input portion 3008, and an antenna 3009.

Embodiment 13

Figure 20:
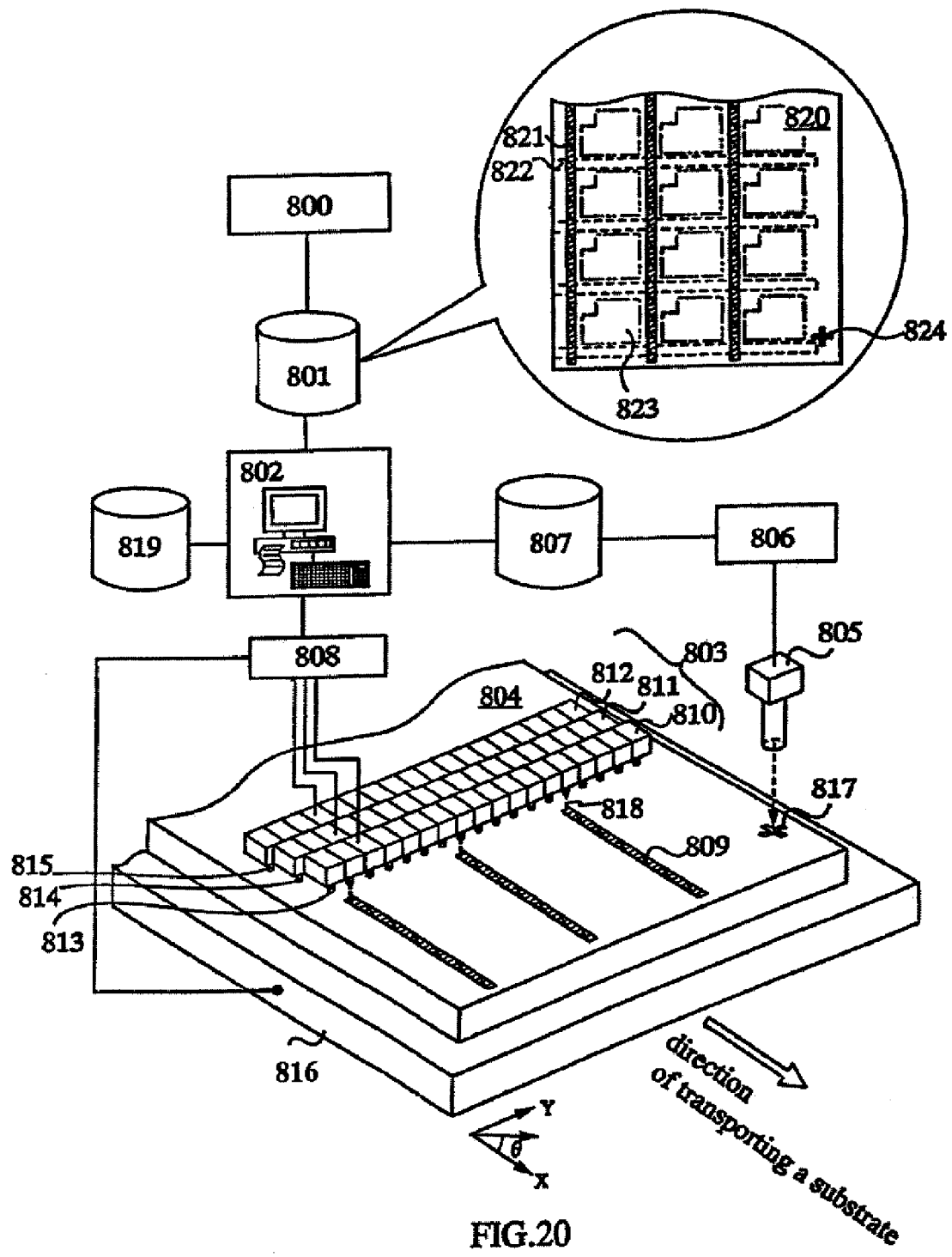
FIG. 20 shows a configuration of a droplet discharging system.

A light-emitting device according to the present invention is preferably formed by a droplet discharging system shown in FIG. 20. Firstly, a circuit design is conducted such as a CAD, a CAM, a CAE, or the like, and a desired layout of a thin film and an alignment marker is determined by a circuit design tool 800.

Data 801 of a thin film pattern including a designed layout of a thin film and an alignment marker is inputted into a computer 802 for controlling a droplet discharging device via an information network such as a memory medium, a LAN (Local Area Network), or the like. Based on the data 801 of a thin film pattern, a nozzle having a discharge opening with an optimum diameter, or which is connected to a tank for storing the composite including a material for forming the thin film, is selected among other nozzles (devices for spouting out liquids or gasses from a fine-ended opening) of a droplet discharging means 803; then, a scanning path (moving path) of the droplet discharging means 803 is determined. In case that an optimum nozzle has been determined in advance, only a moving path of the nozzle may be determined.

An alignment marker 817 is formed by photolithography technique or laser light over a substrate 804 to be provided with the thin film. The substrate provided with an alignment marker is put on a stage 816 in the droplet discharging device, and the position of the alignment marker is detected by a imaging means 805 installed in the device, then, it is inputted as position information 807 into a computer 802 via an image processing device 806. The computer 802 verifies the data 801 of the thin film pattern designed by a CAD or the like and the position information 807 obtained by the imaging means 805 to conduct alignment of the substrate 804 and the droplet discharging means 803.

Thereafter, the droplet discharging means 803 controlled by a controller 808 discharges a composite 818 according to the determined scanning path, and a desired thin film pattern 809 is formed. The discharge quantity of the composite can be appropriately controlled by selecting the diameter of a discharge opening. However, the discharge quantity is slightly varied by several conditions such as the moving speed of the discharge opening, the distance between the discharge opening and the substrate, the discharging speed of a composite, the atmosphere of the discharging space, the temperature or the humidity of the discharging space, or the like. Hence, it is desired to control these conditions. Optimum conditions are preferably identified in advance by experiments or evaluations, and these results are preferably databased per materials of the composite.

As a thin film pattern data, a circuit diagram or the like of an active matrix TFT substrate used for a liquid crystal display device, an electroluminescent display device, or the like can be nominated. A circuit diagram in a circle of FIG. 20 shows a schematic view for showing a conductive film used for such the active matrix TFT substrate. Reference numeral 821 denotes a so-called gate wiring; 822, a source signal line (second wiring); 823, a pixel electrode, or a hole injecting electrode or an electron injecting electrode; 820, a substrate; and 824, an alignment marker. Of course, a thin film pattern 809 corresponds to the gate wiring 821 in thin film pattern information.

Further, the droplet discharging means 803 has, but not exclusively, an integrated combination of nozzles 810, 811, and 812. Each nozzle has a plurality of discharge openings 813, 814, and 815. The foregoing thin film pattern 809 is formed by selecting a predetermined discharge opening 813 in the nozzle 810.

The droplet discharging means 803 is preferably provided with a plurality of nozzles having different discharge openings, discharge quantity, or nozzle pitches to be able to manufacture thin film patterns having various line widths and to improve tact time. The distances between the discharge openings are preferably narrow as much as possible. Further, a nozzle having a length of 1 m or more is preferably provided to conduct high throughput discharging over a substrate having a size of from 1×1 m or more, or a twice or three times as large as that. The droplet discharging means 803 may be retractable to control freely the distance between the discharge openings. To obtain high resolution, that is, to depict a smooth pattern, the nozzle or a head may be leaned. Accordingly, the drawing on a large area such as a rectangular area becomes possible.

Nozzles of the head having different pitches may be provided to one head in parallel. In this instance, discharge opening diameters may be the same or different. In case of the droplet discharging device using a plurality of nozzles as above mentioned, it is required that a waiting position for putting away a nozzle not in use is provided. The waiting position can be provided with a gas supplying means and a showerhead to substitute the atmosphere in the waiting position for the atmosphere that is the same as the gas of a solvent of the composite. Accordingly, the desiccation can be prevented to some extent. Moreover, a clean unit or the like that supplies clean air to reduce dust in a work place may be provided.

Figure 21A:
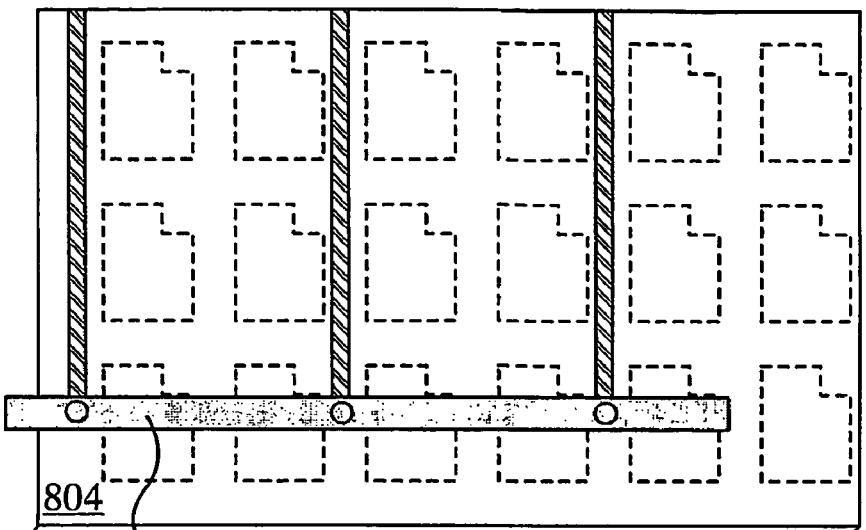
FIGS. 21A and 21B are explanatory views for showing a formation by discharging separately even-numbered and odd numbered wirings using a nozzle with a pitch of n-times as a pixel pitch according to Embodiment Mode.
Figure 21B:
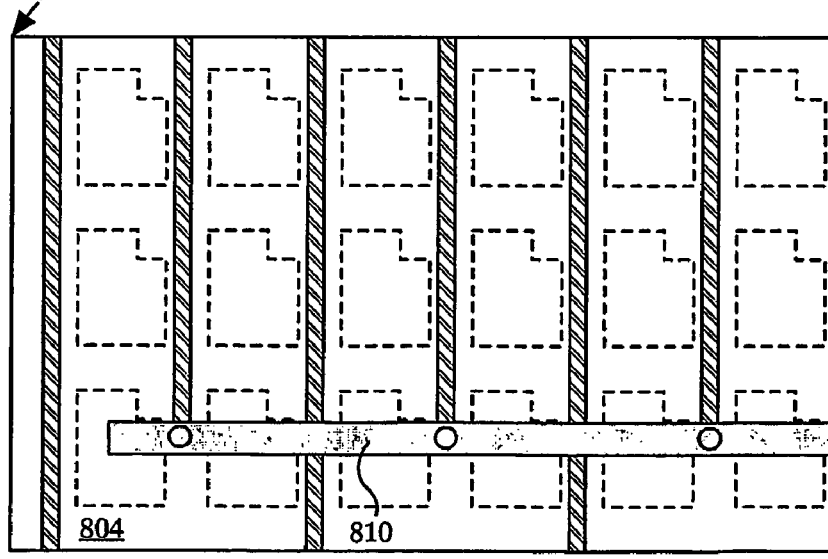
Figure 22A:
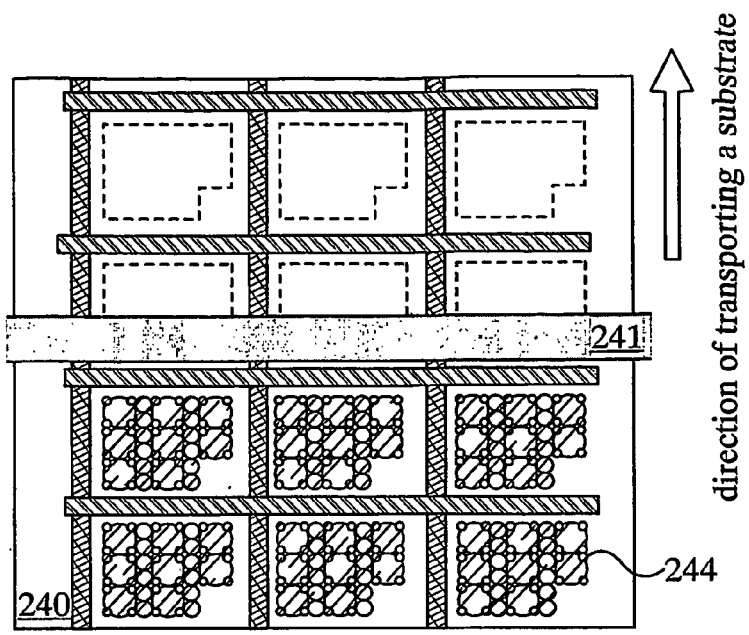
FIGS. 22A to 22D are explanatory views for showing a formation by discharging with a plurality of nozzles having different discharge opening diameters according to Embodiment Mode.
Figure 22B:
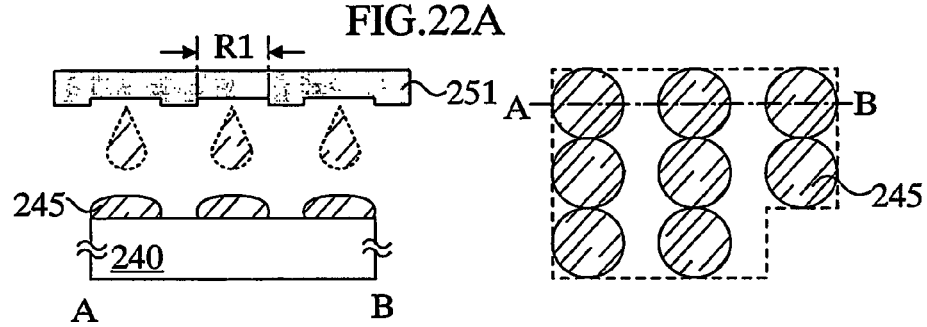
Figure 22C:
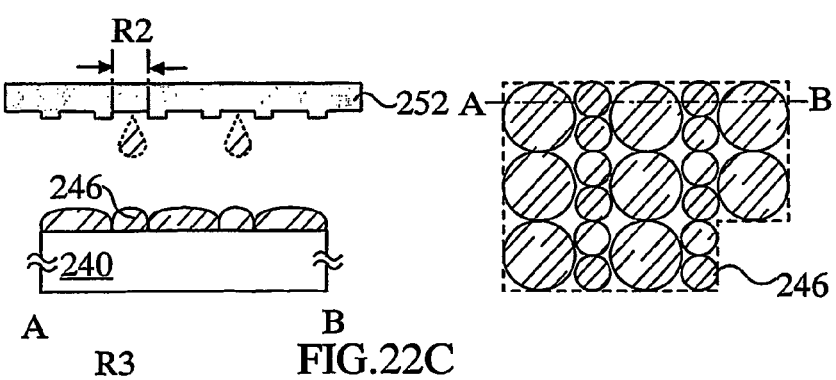
Figure 22D:
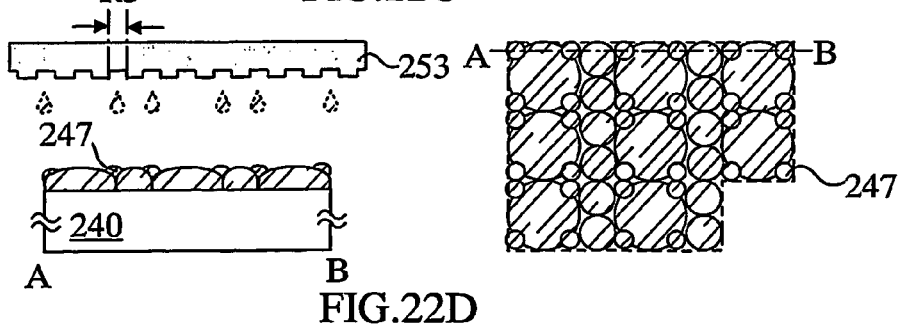

In case that the distances between discharge openings can not be narrowed due to the specifications of the nozzle 803, the pitch of a nozzle may be designed to be integer multiple of a pixel in a display device. Therefore, as shown in FIGS. 21A and 21B, a composite can be discharged over the substrate 804 by shifting the nozzle 803. Odd numbered lines are drawn in FIGS. 21A and 21B As the imaging means 805, a camera using a semiconductor element that converts the strong and weak of light to an electric signal such as a CCD (charge coupled device) can be used.

The foregoing method is to scan the fixed substrate 804 on a stage 816 by the droplet discharging means 803 along with the determined path in order to form the thin film pattern 809. On the other hand, the thin film pattern 809 may be formed in the procedure, that is, the droplet discharging means 803 is fixed, and the stage 809 is transported in XYθ directions along with a path determined by the data 801 of a thin film pattern. In case that the droplet discharging means 803 has a plurality of nozzles, it is required to determine a nozzle having a discharge opening with an optimum diameter, which stores a composite containing a material for forming the thin film or which is connected to a tank for storing the composite.

Further, a plurality of nozzles having redundancy may be used. For example, when the nozzle 812 (or 811) discharges a composite firstly, discharge conditions may be controlled so that the nozzle 810 discharges a composite simultaneously with the discharge of the nozzle 812 (or 811). Accordingly, a composite can be discharged from the back nozzle 810 despite that the front nozzle has some troubles such as the blockage in the discharge openings, and so it becomes possible at least to prevent wirings from breaking or the like.

The foregoing method uses only one predetermined discharge opening of the nozzle 810 to form the thin film pattern 809. Alternatively, as shown in FIGS. 22 to 25, a plurality of nozzles can be used to discharge a composite depending on the line width or thickness of a thin film to be formed.

Figure 23A:
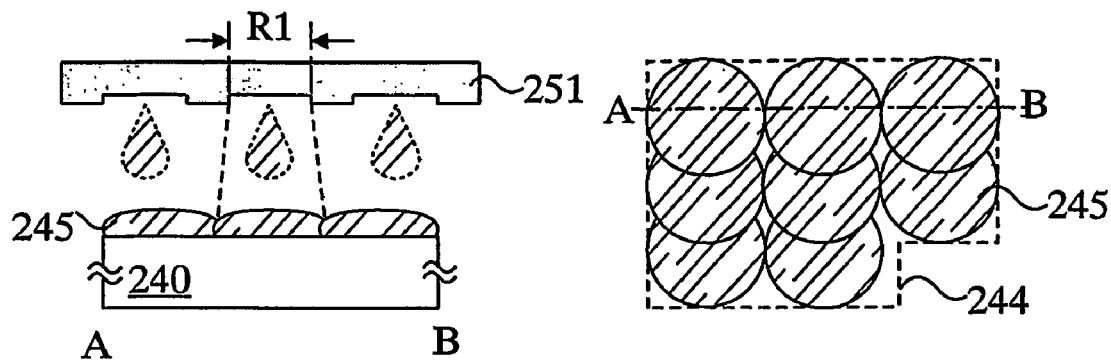
FIGS. 23A to 23C are explanatory views for showing a formation by discharging with a plurality of nozzles having different discharge opening diameters according to Embodiment Mode.
Figure 23B:
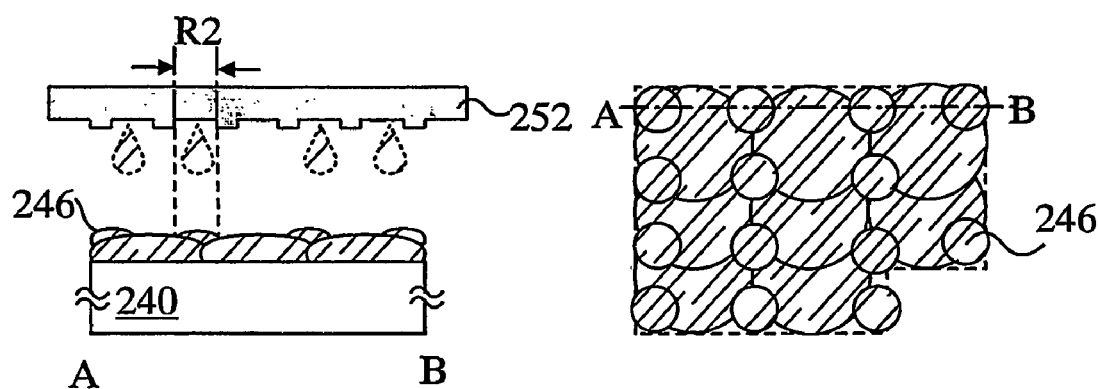
Figure 23C:
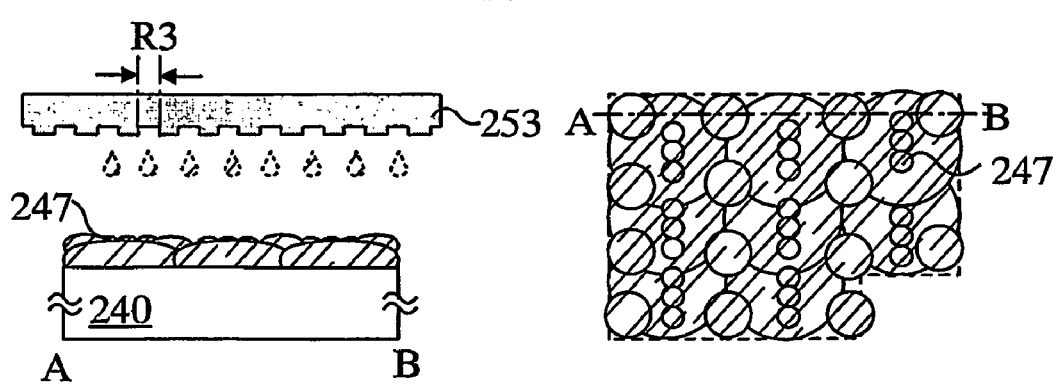

FIGS. 22 and 23 show that, for example, a pixel electrode pattern 244 is formed over a substrate 240. Here, a droplet discharging means 241 composed of a three nozzles 251 to 253 having different sizes of $R_1$, $R_2$, and $R_3$ ($R_1>R_2>R_3$) is used. Firstly, a composite 245 is discharged by using the nozzle 251 having a discharge opening with a maximum diameter. Next, the nozzle 252 having a discharge opening with a smaller diameter than that of the nozzle 251 is used to discharge selectively a composite 246 at the portion that cannot be drawn by the discharge opening with a maximum diameter or that is provided especially with unevenness. Thereafter, the surface of the pattern is smoothed as the need arises by selectively discharging a composite 247 with the nozzle 253 having a discharge opening with a minimum diameter. The method can be effectively used to manufacture a comparative big conductor such as a pixel electrode. A planarized pattern with no unevenness can be manufactured by this method.

Figure 24:
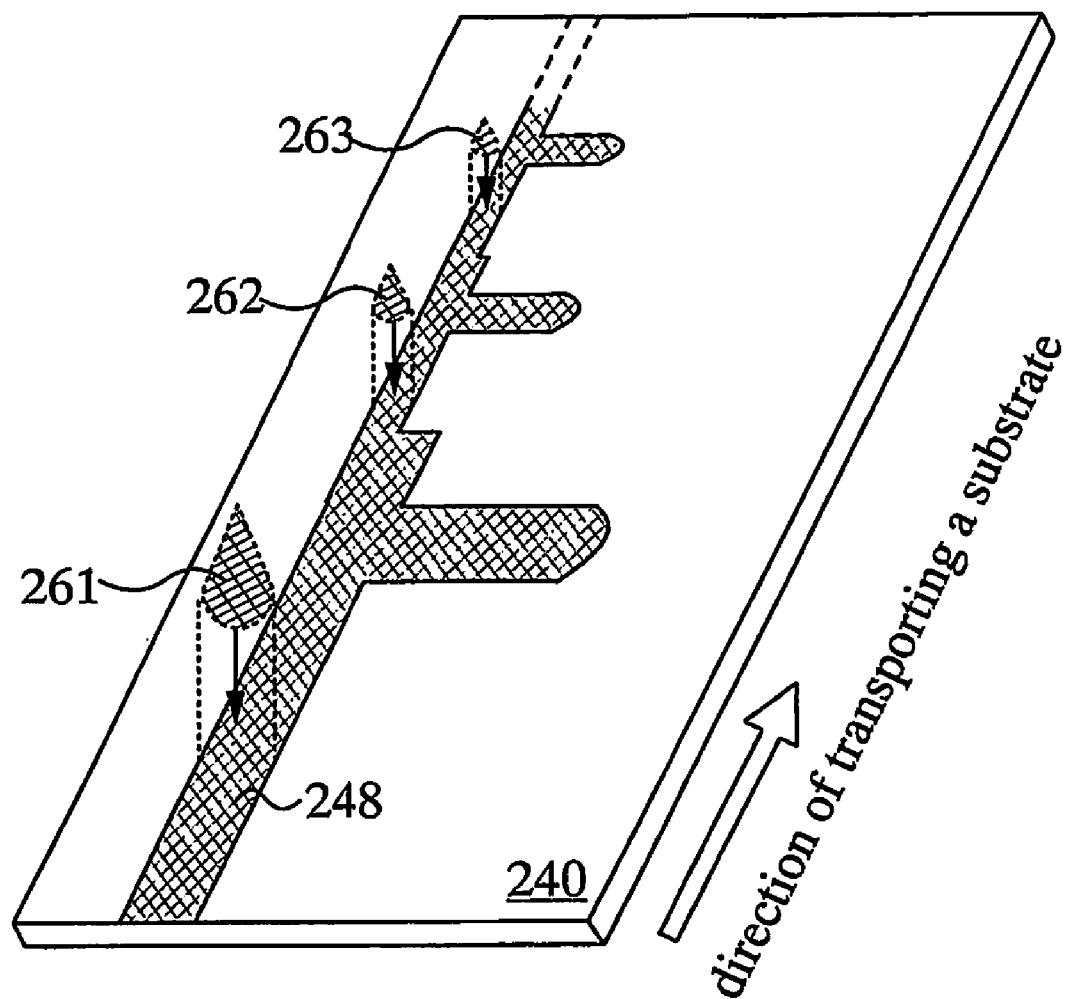
FIG. 24 is an explanatory view for showing a formation by discharging with a plurality of nozzles having different discharge opening diameters according to Embodiment.

FIG. 24 shows the state that a wiring pattern 248 is formed over the substrate 240. As the droplet discharging means, the foregoing nozzles 251 to 253 are used. Since the quantity of each droplet 261 to 263 discharged from these nozzles is different, a pattern with different line widths can be easily manufactured as illustrated in FIG. 24.

Figure 25A:
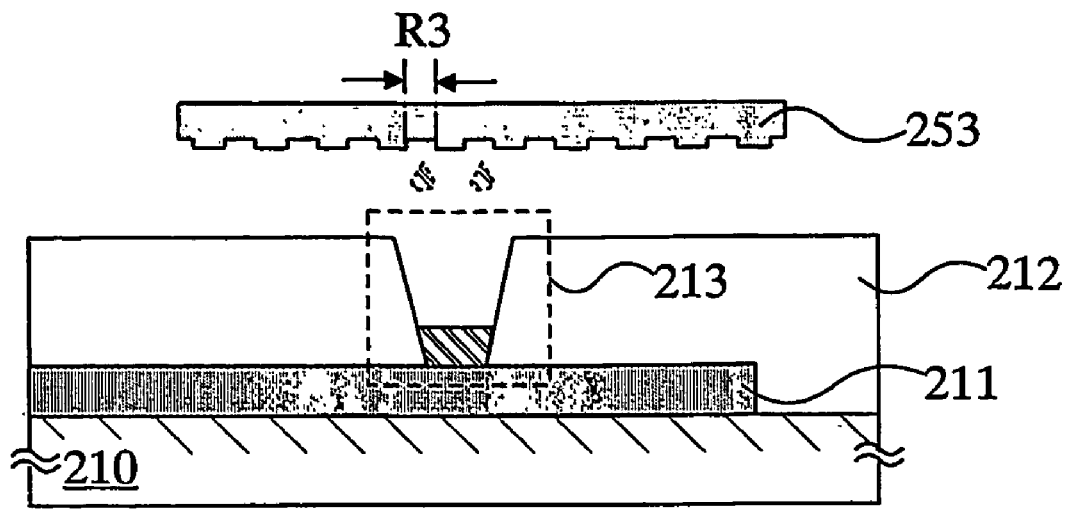
FIGS. 25A to 25C are explanatory views for showing an opening portion filled with a conductive material by discharging with a plurality of nozzles having different discharge opening diameters according to Embodiment Mode.
Figure 25B:
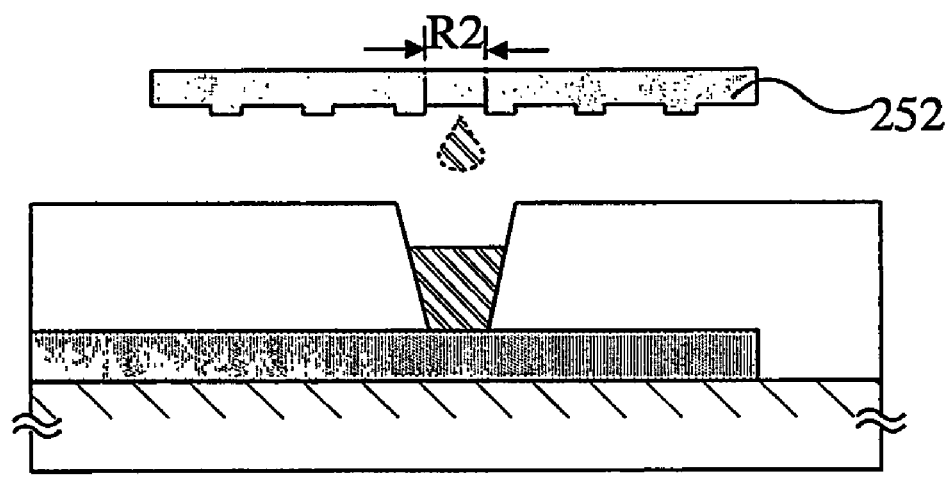
Figure 25C:
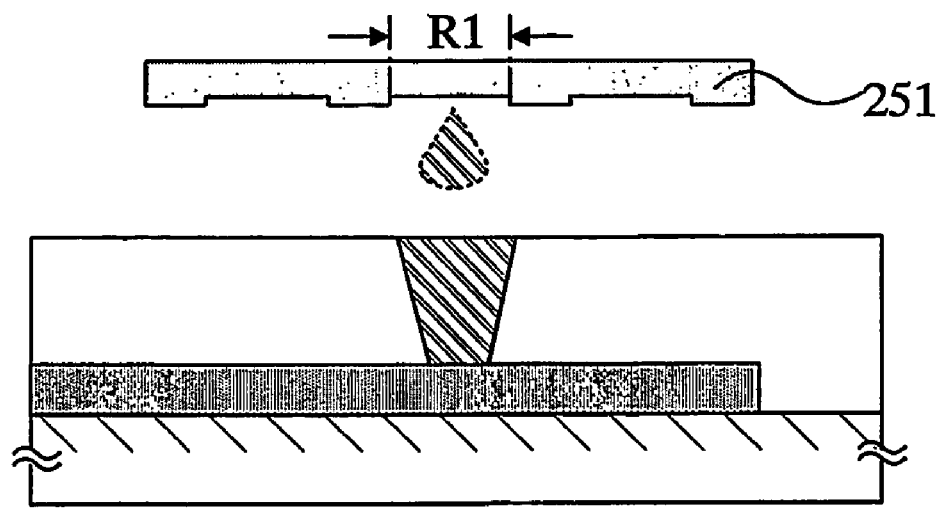

FIG. 25 shows a method for forming, for example, a conductive film by sequentially discharging a composite to fill an opening portion 213. Reference numeral 210 denotes a substrate; 211, a semiconductor or a conductor; and 212, an insulator. The insulator 212 is provided with an opening 213. The composite is discharged by a droplet discharging means comprising a plurality of nozzles 251 to 253 arranged in a plurality of lines having discharging openings arranged in uniaxial direction at the foregoing each line. The diameter of the opening becomes large toward the bottom to the top. Firstly, the bottom portion of the opening 213 is filled with a composite by the nozzle 253 having a discharge opening with a diameter of $R_3$. Then, the opening 213 is filled with a composite up to the middle by the nozzle 252 having a discharge opening with a diameter of $R_2$. And then, the opening 213 is filled with a composite up to the top by the nozzle 251 having a discharge opening with a diameter of $R_1$. According to this method, a planarized conductive layer can be formed by discharging a composite to fill the opening. Therefore, the insulator 212 having an opening with a high aspect ratio can be provided with a planarized wiring without generating a void.

As above mentioned, a droplet discharging system used for forming a thin film or a wiring comprises an inputting means for inputting data for showing a thin film pattern; a setting means for setting a moving path of a nozzle for discharging a composite containing a material for forming the thin film; an imaging means for detecting an alignment marker formed over a substrate; and a controlling means for controlling moving path of the nozzle. Therefore, a nozzle or a moving path of a substrate in droplet discharging is required to be accurately controlled. By installing a program for controlling conditions of discharging a composite to a computer for controlling the droplet discharging system, conditions such as a moving speed of a substrate or a nozzle, discharge quantity of a composite, a spout distance, spout speed, a discharge atmosphere, discharge temperature, discharge humidity, heating temperature for a substrate, and the like can be accurately controlled.

Accordingly, a thin film or a wiring having a desired width, thickness, and form can be precisely conducted at a desired portion under a high throughput and a short tact time. Moreover, manufacturing yields of a semiconductor element such as a TFT manufactured by using the thin film or the wiring, a light-emitting device such as a liquid crystal display or an organic electroluminescent display manufactured by using the semiconductor element, an LSI, or the like can be improved. Especially, according to the present invention, a thin film or a wiring can be formed at any portion, and a width, a thickness, and a form of the pattern can be controlled. Therefore, a large area's semiconductor element substrate having the size of from 1×1 m or more, or a twice or three times as large as that can be manufactured at low costs in high yields.

The invention claimed is:

1. A method for manufacturing a light-emitting device having, at least a first semiconductor element and a second semiconductor element in one pixel of the light-emitting device, said method comprising the steps of:
    forming a gate electrode by discharging a composite containing a first conductive material over a substrate;
    forming a gate insulating film over the gate electrode
    forming a first semiconductor film over the gate insulating film;
    forming a second semiconductor film containing an impurity element having a conductivity type over the first semiconductor film;
    forming a source electrode and a drain electrode by discharging a composite containing a second conductive material over the second semiconductor film;
    forming a source region and a drain region by removing a part of the second semiconductor film using the source electrode and the drain electrode as a mask;
    forming an insulating film above a portion serving as a channel region in the semiconductor film;
    forming an island-like semiconductor film by removing a part of the first semiconductor film using the source electrode, the drain electrode, and the insulating film as a mask;
    wherein a contact hole is formed by removing at least a part of the gate insulating film over a gate electrode of the second semiconductor element; and a wiring for connecting the source electrode or the drain electrode of the first semiconductor element to the gate electrode of the second semiconductor element is formed by discharging a composite containing a third conductive material via the contact hole.

2. A method for manufacturing a light-emitting device according to claim 1, wherein the insulating film comprises a material selected from the group consisting of polyimide, acrylic, or a material which has a bond of silicon and oxygen, and which includes at least hydrogen as a substituent, or at least one selected from the group consisting of fluoride, alkyl group, and aromatic hydrocarbon as the substituent.

3. An electroluminescent television device having a light-emitting device manufactured by the method for manufacturing according to claim 1.

4. A method for manufacturing a light-emitting device having, at least a first semiconductor element and a second semiconductor element in one pixel of the light-emitting device, said method comprising the steps of:
    forming a gate electrode by discharging a composite containing a first conductive material over a substrate;
    forming a gate insulating film over the gate electrode
    forming a first semiconductor film over the gate insulating film;
    forming a second semiconductor film containing an impurity element having a conductivity type over the first semiconductor film;
    forming a source electrode and a drain electrode by discharging a composite containing a second conductive material over the second semiconductor film;
    forming a source region and a drain region by removing a part of the second semiconductor film using the source electrode and the drain electrode as a mask;
    forming an insulating film above a portion serving as a channel region in the first semiconductor film;
    forming an island-like semiconductor film and an island-like gate insulating film by removing a part of the first semiconductor film and a part of the gate insulating film using the source electrode, the drain electrode, and the insulating film as a mask;
    wherein a contact hole is formed by removing at least a part of the gate insulating film over a gate electrode of the second semiconductor element; and a wiring for connecting the source electrode or the drain electrode of the first semiconductor element to the gate electrode of the second semiconductor element is formed by discharging a composite containing a third conductive material via the contact hole.

5. A method for manufacturing a light-emitting device according to claim 4, wherein the insulating film comprises a material selected from the group consisting of polyimide, acrylic, or a material which has a bond of silicon and oxygen, and which includes at least hydrogen as a substituent, or at least one selected from the group consisting of fluoride, alkyl group, and aromatic hydrocarbon as the substituent.

6. An electroluminescent television device having a light-emitting device manufactured by the method for manufacturing according to claim 4.

7. A method for manufacturing a light-emitting device having, at least a first semiconductor element and a second semiconductor element in one pixel of the light-emitting device, said method comprising the steps of:
    forming a gate electrode by discharging a composite containing a first conductive material over a substrate;
    forming a gate insulating film over the gate electrode forming a first semiconductor film over the gate insulating film;

forming a second semiconductor film containing an impurity element having a conductivity type over the first semiconductor film;

forming a source electrode and a drain electrode by discharging a composite containing a second conductive material over the second semiconductor film;

forming a source region and a drain region by removing a part of the second semiconductor film using the source electrode and the drain electrode as a mask;

forming an insulating film above a portion serving as a channel region in the first semiconductor film;

forming an island-like semiconductor film by removing a part of the first semiconductor film using the source electrode, the drain electrode, and the insulating film as a mask;

wherein a column-like conductor is formed by discharging a composite containing a third conductive material which is the same or different from the first conductive material above a part of a gate electrode of the second semiconductor element before forming the gate insulating film; and a wiring for connecting the source electrode or the drain electrode of the first semiconductor element to the column-like conductor is formed by discharging a composite containing a fourth conductive material.

8. A method for manufacturing a light-emitting device according to claim 7, wherein the insulating film comprises a material selected from the group consisting of polyimide, acrylic, or a material which has a bond of silicon and oxygen, and which includes at least hydrogen as a substituent, or at least one selected from the group consisting of fluoride, alkyl group, and aromatic hydrocarbon as the substituent.

9. An electroluminescent television device having a light-emitting device manufactured by the method for manufacturing according to claim 7.

10. A method for manufacturing a light-emitting device having, at least a first semiconductor element and a second semiconductor element in one pixel of the light-emitting device, said method comprising the steps of:

forming a gate electrode by discharging a composite containing a first conductive material over a substrate;

forming a gate insulating film over the gate electrode forming a first semiconductor film over the gate insulating film;

forming a second semiconductor film containing an impurity element having a conductivity type over the semiconductor film;

forming a source electrode and a drain electrode by discharging a composite containing a second conductive material over the second semiconductor film;

forming a source region and a drain region by removing a part of the second semiconductor film using the source electrode and the drain electrode as a mask;

forming an insulating film above a portion serving as a channel region in the first semiconductor film;

forming an island-like semiconductor film and an island-like gate insulating film by removing a part of the first semiconductor film and a part of the gate insulating film using the source electrode, the drain electrode, and the insulating film as a mask;

wherein a column-like conductor is formed by discharging a composite containing a third conductive material which is the same or different from the first conductive material above a part of a gate electrode of the second semiconductor element before forming the gate insulating film; and a wiring for connecting the source electrode or the drain electrode of the first semiconductor element to the column-like conductor is formed by discharging a composite containing a fourth conductive material.

11. A method for manufacturing a light-emitting device according to claim 10, wherein the insulating film comprises a material selected from the group consisting of polyimide, acrylic, or a material which has a bond of silicon and oxygen, and which includes at least hydrogen as a substituent, or at least one selected from the group consisting of fluoride, alkyl group, and aromatic hydrocarbon as the substituent.

12. An electroluminescent television device having a light-emitting device manufactured by the method for manufacturing according to claim 10.

13. A method for manufacturing a light-emitting device having, at least a first semiconductor element and a second semiconductor element in one pixel of the light-emitting device, said method comprising the steps of:

forming a gate electrode by discharging a composite containing a first conductive material over a substrate;

forming a gate insulating film over the gate electrode forming a first semiconductor film over the gate insulating film;

forming a second semiconductor film containing an impurity element having a conductivity type over the semiconductor film;

forming a source electrode and a drain electrode by discharging a composite containing a second conductive material over the second semiconductor film;

forming a source region and a drain region by removing a part of the second semiconductor film using the source electrode and the drain electrode as a mask;

forming an insulating film above a portion serving as a channel region in the first semiconductor film;

forming an island-like semiconductor film by removing a part of the first semiconductor film using the source electrode, the drain electrode, and the insulating film as a mask;

wherein a wiring is formed by discharging a composite containing a third conductive material so as to be in contact with the source electrode or the drain electrode of the first semiconductor element; a contact hole is formed by removing at least a part of the gate insulating film over a gate electrode of the second semiconductor element using the wiring as a mask; and a conductor for connecting the wiring to the gate electrode of the second semiconductor element is formed by discharging a composite containing a fourth conductive material over the contact hole.

14. A method for manufacturing a light-emitting device according to claim 13, wherein the insulating film comprises a material selected from the group consisting of polyimide, acrylic, or a material which has a bond of silicon and oxygen, and which includes at least hydrogen as a substituent, or at least one selected from the group consisting of fluoride, alkyl group, and aromatic hydrocarbon as the substituent.

15. An electroluminescent television device having a light-emitting device manufactured by the method for manufacturing according to claim 13.

16. A method for manufacturing a light-emitting device having, at least a first semiconductor element and a second semiconductor element in one pixel of the light-emitting device, said method comprising the steps of:

forming a gate electrode by discharging a composite containing a first conductive material over a substrate;

forming a gate insulating film over the gate electrode forming a first semiconductor film over the gate insulating film;

forming a second semiconductor film containing an impurity element having a conductivity type over the semiconductor film;

forming a source electrode and a drain electrode by discharging a composite containing a second conductive material over the second semiconductor film;

forming a source region and a drain region by removing a part of the second semiconductor film using the source electrode and the drain electrode as a mask;

forming an insulating film above a portion serving as a channel region in the first semiconductor film;

forming an island-like semiconductor film and an island-like gate insulating film by removing a part of the first semiconductor film and a part of the gate insulating film using the source electrode, the drain electrode, and the insulating film as a mask;

wherein a wiring which is in contact with the source electrode or the drain electrode is formed by discharging a composite containing a third conductive material so as to be in contact with the source electrode or the drain electrode of the first semiconductor element; a contact hole is formed by removing at least a part of the gate insulating film over a gate electrode of the second semiconductor element using the wiring as a mask; and a conductor for connecting the wiring to the gate electrode of the second semiconductor element is formed by discharging a composite containing a fourth conductive material over the contact hole.

17. A method for manufacturing a light-emitting device according to claim 16, wherein the insulating film comprises a material selected from the group consisting of polyimide, acrylic, or a material which has a bond of silicon and oxygen, and which includes at least hydrogen as a substituent, or at least one selected from the group consisting of fluoride, alkyl group, and aromatic hydrocarbon as the substituent.

18. An electroluminescent television device having a light-emitting device manufactured by the method for manufacturing according to claim 16.

19. A method for manufacturing a light-emitting device having, at least a first semiconductor element and a second semiconductor element in one pixel of the light-emitting device, said method comprising the steps of:

forming a gate electrode by discharging a composite containing a first conductive material over a substrate;

forming a gate insulating film over the gate electrode forming a semiconductor film over the gate insulating film;

forming a semiconductor film containing an impurity element having a conductivity type over the semiconductor film;

forming a source electrode and a drain electrode by discharging a composite containing a second conductive material over the semiconductor film containing a single conductivity impurity element;

forming a source region and a drain region by removing a part of the semiconductor film containing a single conductivity impurity element using the source electrode and the drain electrode as a mask;

forming an insulating film above a portion serving as a channel region in the semiconductor film;

forming an island-like semiconductor film by removing a part of the semiconductor film using the source electrode, the drain electrode, and the insulating film as a mask.

20. A method for manufacturing a light-emitting device according to claim 19, wherein the insulating film comprises a material selected from the group consisting of polyimide, acrylic, or a material which has a bond of silicon and oxygen, and which includes at least hydrogen as a substituent, or at least one selected from the group consisting of fluoride, alkyl group, and aromatic hydrocarbon as the substituent.

21. An electroluminescent television device having a light-emitting device manufactured by the method for manufacturing according to claim 19.

22. A method for manufacturing a light-emitting device having, at least a first semiconductor element and a second semiconductor element in one pixel of the light-emitting device, said method comprising the steps of:

forming a gate electrode by discharging a composite containing a first conductive material over a substrate;

forming a gate insulating film over the gate electrode;

forming a semiconductor film over the gate insulating film;

forming a semiconductor film containing an impurity element having a conductivity type over the semiconductor film;

forming a source electrode and a drain electrode by discharging a composite containing a second conductive material over the semiconductor film containing an impurity element having a conductivity type;

forming a source region and a drain region by removing a part of the semiconductor film containing an impurity element having a conductivity type using the source electrode and the drain electrode as a mask;

forming an insulating film above a portion serving as a channel region in the semiconductor film; pg,53 forming an island-like semiconductor film and an island-like gate insulating film by removing a part of the semiconductor film using the source electrode, the drain electrode, and the insulating film as a mask.

23. A method for manufacturing a light-emitting device according to claim 22, wherein the insulating film comprises a material selected from the group consisting of polyimide, acrylic, or a material which has a bond of silicon and oxygen, and which includes at least hydrogen as a substituent, or at least one selected from the group consisting of fluoride, alkyl group, and aromatic hydrocarbon as the substituent.

24. An electroluminescent television device having a light-emitting device manufactured by the method for manufacturing according to claim 22.

* * * * *

UNITED STATES PATENT AND TRADEMARK OFFICE
CERTIFICATE OF CORRECTION

PATENT NO. : 7,598,129 B2  Page 1 of 1
APPLICATION NO. : 10/576692
DATED : October 6, 2009
INVENTOR(S) : Kanno et al.

It is certified that error appears in the above-identified patent and that said Letters Patent is hereby corrected as shown below:

Column 9, line 41 the symbol "(Ar)" should be deleted and replaced with --(As)--.

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

PATENT NO.       : 7,598,129 B2
APPLICATION NO.  : 10/576692
DATED            : October 6, 2009
INVENTOR(S)      : Kanno et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 570 days.

Signed and Sealed this

Twenty-eighth Day of September, 2010

David J. Kappos
*Director of the United States Patent and Trademark Office*